(12) United States Patent
Bhattacharyya et al.

(10) Patent No.: US 6,979,880 B2
(45) Date of Patent: Dec. 27, 2005

(54) SCALABLE HIGH PERFORMANCE ANTIFUSE STRUCTURE AND PROCESS

(75) Inventors: Arup Bhattacharyya, Essex Junction, VT (US); Joseph E. Geusic, Berkeley Heights, NJ (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/931,601

(22) Filed: Aug. 31, 2004

(65) Prior Publication Data

US 2005/0023638 A1 Feb. 3, 2005

Related U.S. Application Data

(62) Division of application No. 10/106,916, filed on Mar. 25, 2002.

(51) Int. Cl.[7] .............................................. H01L 29/00
(52) U.S. Cl. ..................... 257/530; 257/50; 257/209; 257/529; 438/131; 438/467; 438/600; 438/647
(58) Field of Search ............................. 257/50, 52, 57, 257/209, 529, 530; 438/131, 381, 466, 467, 598, 600, 601, 647

(56) References Cited

U.S. PATENT DOCUMENTS

| | | | |
|---|---|---|---|
| 4,962,058 A | 10/1990 | Cronin et al. ................ | 437/187 |
| 5,110,754 A | 5/1992 | Lowrey et al. ............... | 437/52 |
| 5,250,459 A | 10/1993 | Lee ............................. | 437/52 |
| 5,404,029 A | 4/1995 | Husher et al. ................ | 257/50 |
| 5,639,684 A | 6/1997 | Kwok ......................... | 438/600 |
| 5,811,870 A | 9/1998 | Bhattacharyya et al. .... | 257/530 |
| 5,834,824 A | 11/1998 | Shepherd et al. ........... | 257/530 |
| 5,903,041 A | 5/1999 | La Fleur et al. ............. | 257/530 |
| 5,962,910 A | 10/1999 | Hawley et al. .............. | 257/530 |
| 5,969,983 A | 10/1999 | Thakur et al. ............... | 365/149 |
| 5,973,380 A | 10/1999 | Cutter et al. ................. | 257/530 |
| 6,016,001 A | 1/2000 | Sanchez et al. ............. | 257/530 |

(Continued)

OTHER PUBLICATIONS

"CRC handbook of chemistry and physics", *49th edition, CRC Press*, Cleveland, Ohio, (1968–1969),E–61.

(Continued)

*Primary Examiner*—Donghee Kang
(74) *Attorney, Agent, or Firm*—Schwegman, Lundberg, Woessner & Kluth, P.A.

(57) ABSTRACT

Systems and methods are provided for a scalable high-performance antifuse structure and process that has a low RC component, a uniform dielectric breakdown, and a very low, effective dielectric constant ($k_{eff}$) such that a programming pulse voltage is scalable with Vdd. One aspect of the present subject matter is an antifuse device that is positioned or coupled between a first metal level and a second metal level. One embodiment of the antifuse device includes a porous antifuse dielectric layer, and at least one injector Silicon-Rich-Insulator (SRI) layer in contact with the porous antifuse dielectric layer. In one embodiment, the porous antifuse dielectric layer includes $SiO_2$ formed with air-filled voids. In one embodiment, the at least one injector SRI layer includes two injector Silicon-Rich-Nitride layers that sandwich the porous antifuse dielectric layer. Other aspects are provided herein.

41 Claims, 16 Drawing Sheets

U.S. PATENT DOCUMENTS

| | | | |
|---|---|---|---|
| 6,069,064 A | 5/2000 | Cutter et al. | 438/600 |
| 6,077,792 A | 6/2000 | Farrar | 438/780 |
| 6,084,814 A | 7/2000 | Casper et al. | 365/225.7 |
| 6,088,282 A | 7/2000 | Loughmiller et al. | 365/225.7 |
| 6,097,077 A | 8/2000 | Gordon et al. | 257/530 |
| 6,146,925 A | 11/2000 | Dennison | 438/131 |
| 6,252,293 B1 | 6/2001 | Seyyedy et al. | 257/530 |
| 6,284,675 B1 | 9/2001 | Jin et al. | 438/778 |
| 6,288,437 B1 | 9/2001 | Forbes et al. | 257/530 |
| 6,291,871 B1 | 9/2001 | Dennison | 257/530 |
| 6,323,536 B1 | 11/2001 | Cutter et al. | 257/530 |
| 6,344,373 B1 | 2/2002 | Bhattacharyya et al. | 438/131 |
| 6,351,425 B1 | 2/2002 | Porter | 365/225.7 |
| 6,383,924 B1 | 5/2002 | Farrar et al. | 438/667 |
| 6,423,582 B1 | 7/2002 | Fischer et al. | 438/132 |
| 6,444,558 B1 | 9/2002 | Cutter et al. | 438/600 |
| 6,456,149 B2 | 9/2002 | Cutter et al. | 327/525 |
| 6,458,630 B1 | 10/2002 | Daubenspeck et al. | 438/131 |
| 6,495,395 B2 | 12/2002 | Reinberg | 438/107 |
| 6,498,056 B1 | 12/2002 | Motsiff et al. | 438/131 |
| 6,509,623 B2 | 1/2003 | Zhao | 257/522 |
| 6,525,399 B2 | 2/2003 | Cutter et al. | 257/530 |
| 6,541,811 B2 | 4/2003 | Thakur et al. | 257/303 |
| 6,582,512 B2 | 6/2003 | Geusic et al. | 117/3 |
| 6,630,724 B1 | 10/2003 | Marr | 257/530 |
| 6,657,277 B1 | 12/2003 | Hsieh | 257/530 |
| 6,674,667 B2 | 1/2004 | Forbes | 365/185.24 |
| 2002/0182837 A1 | 12/2002 | Daubenspeck et al. | 438/601 |
| 2003/0042534 A1 | 3/2003 | Bhattacharyya | 257/317 |
| 2003/0071324 A1 | 4/2003 | Motsiff et al. | 257/530 |
| 2003/0181018 A1 | 9/2003 | Geusic et al. | 438/422 |

OTHER PUBLICATIONS

Asoh, H , "Fabrication of ideally ordered anodic porous alumina with 63 nm hole periodicity using sulfuric acid", *Journal of Vacuum Science & Technology B (Microelectronics and Nanometer Structures)*, 19(2), (Mar. 2001),569–72.

Beauvais, J , et al., "Nano–Imprint Lithography using Masks Fabricated by SiDWEL Process", *Tenth Canadian Semiconductor Technology Conference* Ottawa, Canada, (Aug. 13–17, 2001).

Bhattacharyya, A. , "Physical & Electrical Characteristics of LPCVD Silicon Rich Nitride", *ECS Technical Digest, J. Eletrochem. Soc.*, 131(11), 691 RDP, New Orleans,(1984), 469C.

Chou, S Y., et al., "Imprint lithography with sub–10 nm feature size and high throughput", *Microelectronic Engineering*, 35(1–4), (Feb. 1997),237–40.

Chou, S Y., et al., "Sub–10 nm imprint lithography and applications", *Journal of Vacuum Science & Technology B (Microelectronics and Nanometer Structures)*, 15(6), (Nov.–Dec. 1997),2897–904.

Das, B , et al., "Template Based Semiconductor Nanostructure Fabrication and their Applications", *Invited Paper, 11th International Workshop in the Physics of Semiconductor Devices,* (2001),D.1.1.

Devasahayam, A J., et al., "Material Properties of Ion Beam Deposited Oxides for the Opto–Electronic Industry", *Tenth Canadian Semiconductor Technology Conference*, Ottawa, Canada, (Aug. 13–17, 2001).

Jeng, Shin–Puu , et al., "A planarized multilevel interconnect scheme with embedded low–dielectric–constant polymers for sub–quarter–micron applications", *VLSI Technology, 1994. Digest of Technical Papers. 1994 Symposium on*, Jun. 7–9, 1994, (Jun. 1994), 73–74.

Jin, C , "Evaluation of ultra–low–k dielectric materials for advanced interconnects", *Journal of Electronic Materials*, 30(4), (Apr. 2001),284–9.

Jurczak, M , "SON (silicon on nothing)—a new device architecture for the ULSI era", *VLSI Technology, 1999. Digest of Technical Papers. 1999 Symposium on* , Jun. 14–16, 1999, (Jun. 1999),29–30.

Kingery, W D., "Introduction to ceramics", New York, Wiley, (1963),262–263.

Kittel, C A., "Introduction to Solid State Physics", *3rd Edition*, J. Wiley & Sons, (1967),25.

Mizushima, I. , "Empty–space–in–silicon technique for fabricating a silicon–on–nothing structure", *Applied Physics Letters*, 77(20), American Institute of Physics, NY,(Nov. 13, 2000),3290–3292.

Morey, George W., "The properties of glass", Published New York, Reinhold publishing corporation, *Series Monograph series (American Chemical Society)*; No. 77., (1938), 12, 48–49.

Nichols, F A., "Surface–(inteface) and volume–diffusion contributions to morphological changes driven by capillarity", *Transactions of the American Institute of Mining, Metallurgical and Petroleum Engineers*, 233 (10), (1965), 1840–8.

Sato, T , "A new substrate engineering for the formation of empty space in silicon (ESS) induced by silicon surface migration", *International Electron Devices Meeting 1999. Technical Digest,* (1999),517–20.

Sato, T, "Trench transformation technology using hydrogen annealing for realizing highly reliable device structure with thin dielectric films", *1998 Symposium on VLSI Technology Digest of Technical Papers,* (1998),206–7.

Treichel, H , "Low dielectric constant materials", *Journal of Electronic Materials*, 30(4), (Apr. 2001),290–8.

Wojcik, J , et al., "Characterization of Silicon Oxynitride Thin Films Deposited by ECR–PECVD", *Tenth Canadian Semiconductor Technology Conference*, Ottawa, Canada, (Aug. 13–17, 2001).

Zhang, F , "Nanoglass/sup TM/ E copper damascene processing for etch, clean, and CMP", *Proceedings of the IEEE 2001 International Interconnect Technology Conference,* (2001),57–9.

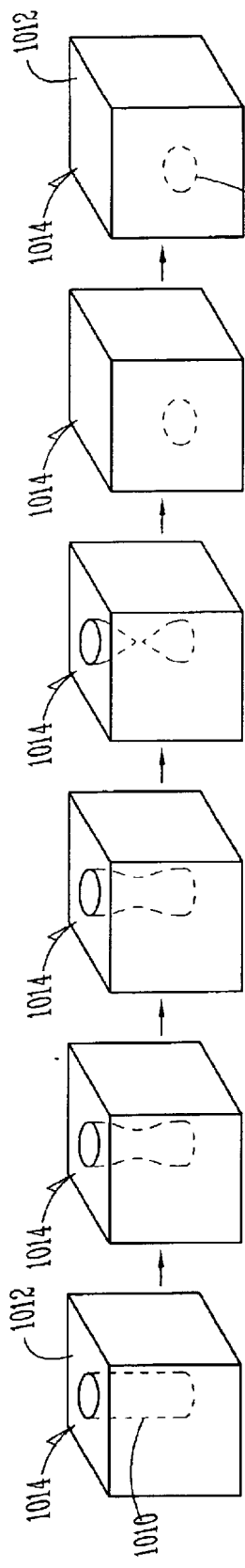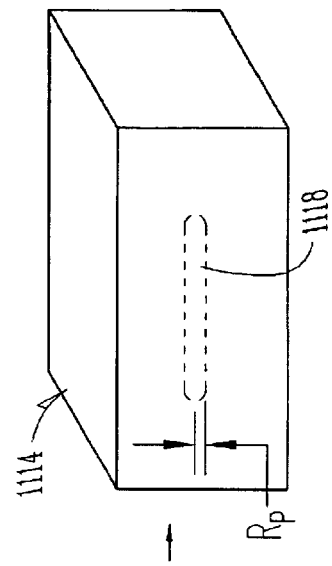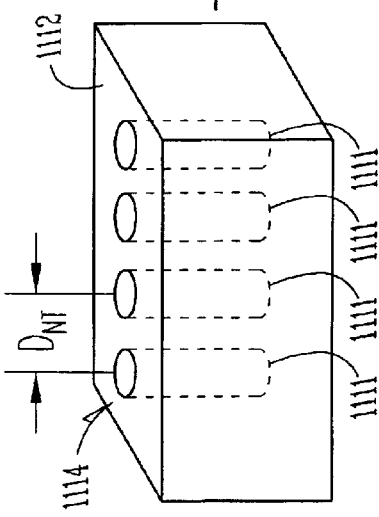

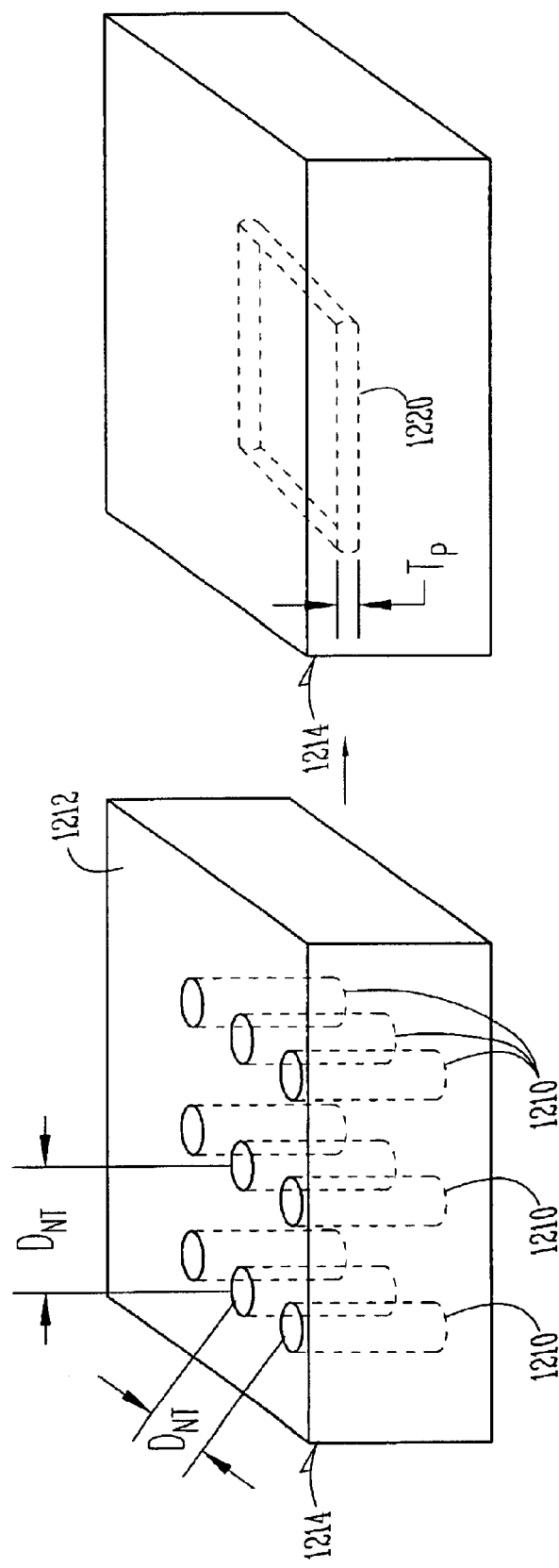

SCALABLE HIGH PERFORMANCE ANTIFUSE STRUCTURE AND PROCESS

CROSS REFERENCE TO RELATED APPLICATIONS

This application is a divisional under 37 C.F.R. 1.53(b) of U.S. application Ser. No. 10/106,916, filed Mar. 25, 2002, which application is incorporated herein by reference.

This application is related to the following co-pending, commonly assigned U.S. patent application which is herein incorporated by reference in its entirety: "Low K Interconnect Dielectric Using Surface Transformation," U.S. application Ser. No. 10/106,915, filed Mar. 25, 2002.

TECHNICAL FIELD OF THE INVENTION

This invention relates generally to integrated circuits and, more particularly, to integrated circuit antifuses.

BACKGROUND OF THE INVENTION

Integrated semiconductor circuits or devices are designed and used for widely differing applications. It often is not cost effective to create separate fabrication lines, with different masks and such, for each small change for various applications. As such, the device is personalized to meet various needs by opening and closing links using various techniques.

One technique for opening a previously closed link involves fuses. The appropriate fuses are blown by a laser or other means to personalize the semiconductor circuit or device. One technique for closing a previously opened link involves antifuses. Antifuses are structures that, when first fabricated, are an open circuit. When the antifuse is "fused," the open circuit becomes closed and conduction across the antifuse becomes possible. Thus, antifuses are used to perform the opposite function of a fuse.

An antifuse structure includes two electrodes separated by a dielectric. Typically an antifuse is fused by applying a sufficient voltage, called a "fusing voltage," across the antifuse structure. This voltage causes a current to flow and the structure to fuse together, and results in a permanent electrical connection. Conventional antifuse structures include a thin layer of dielectric material between two interlevel metallic interconnection layers. The dielectric material is positioned either above or below an interconnecting via-contact between the metal interconnection levels. Conventional dielectric materials include a thin oxide ($SiO_2$), a thin nitride ($Si_3N_4$), a thin amorphous silicon film (a-Si) or a thin composite film of oxide-nitride-oxide (ONO). Each antifuse is in appropriate electrical contact to a specific random logic node of the ALD or FPGA device to be programmed to alter a specific logic state using a programming voltage pulse of desired amplitude and time.

The semiconductor industry continuously strives to reduce the size and cost of integrated circuits. As such, there has been progressive scaling of feature size and power (Vdd). The drive to lower Vdd requires a reduced programming voltage, and requires scaling of the dielectric material of the antifuse. Conventional antifuse devices are fused using high programming voltage pulses as much as 2.5 to 3.0 times the power supply voltage (e.g. 8V to 10V for a Vdd=3.3V). This high voltage requires complex circuits for generating the high programming voltage on-chip as well as complex processing for routing such high voltages across the chip in an integrated circuit that is otherwise scaled for low voltage. Therefore, it is highly desirable to develop an antifuse technology in which the programming voltage for fusing the antifuse scales with the power supply voltage, and preferably below 2×Vdd such that simple circuits are capable of generating this lower programming voltage on-chip.

An antifuse with a thinner dielectric has a reduced programming voltage but a larger capacitance because the capacitance of a dielectric is inversely proportional to the thickness of the dielectric. One particular problem confronting the semiconductor industry is the challenge of reducing antifuse capacitance to enhance programming performance while lowering the programming voltage for Field Programmable Gate Arrays (FPGAs) and Alterable Logic Devices (ALDs). As fabricated, the structure of antifuses is electrically "open" such that it is characterized as being nonconductive and capacitive. This capacitive component of antifuses contributes significantly to the signal transmission delay of FPGA or ALD devices. Thinner oxide provides each antifuse with a higher capacitance, which results in a slower device performance. The increased capacitive components of the antifuses increase RC components, which increases logic delays and adversely affects the performance of the FPGA or ALD devices.

One known antifuse structure includes a composite of silicon-rich-nitride (SRN) and oxide ($SiO_2$) films. These films will be described in more detail below. An effective programming pulse for this antifuse structure approaches 2×Vdd for a Vdd=3.3V. One limitation of these films is the thickness and scalability of the $SiO_2$ layer, and the associated parasitic capacitance. The oxide thickness does not scale proportionately with the scaling of the technology and power supply generations because the antifuse device leakage in the open state is not acceptable.

Therefore, there is a need in the art to provide a scalable high performance antifuse structure and process that has a low RC component, a uniform dielectric breakdown, and a very low, effective dielectric constant ($k_{eff}$) such that the programming pulse voltage is scalable with Vdd and the capacitance is lowered so as to improve circuit performance at low power.

SUMMARY OF THE INVENTION

The above mentioned problems are addressed by the present subject matter and will be understood by reading and studying the following specification. The present subject matter provides a scalable high-performance antifuse structure and process. The antifuse structure has a very low effective dielectric constant ($k_{eff}$) that includes a very low dielectric constant material and air, i.e. a controlled amount of porosity or void, to achieve a low capacitance. As such, the RC component attributable to the antifuse structure is low. Furthermore, the antifuse structure includes injector Silicon Rich Insulator (SRI), such as Silicon Rich Nitride (SRN), to provide a uniform breakdown of the antifuse dielectric and a significantly reduced programming voltage such that the programming voltage is capable of being scaled with Vdd. As such, the present subject matter is capable of being used in high performance and low power applications.

One aspect of the present subject matter is an antifuse device that is positioned or coupled between a first metal level and a second metal level such that the antifuse device is adapted to program a function of a logic device upon the application of a fusing voltage. One embodiment of the antifuse device includes a porous antifuse dielectric layer, and at least one injector Silicon-Rich-Insulator (SRI) layer in contact with the porous antifuse dielectric layer. In one embodiment, the porous antifuse dielectric layer includes $SiO_2$ formed with air-filled voids. In one embodiment, the SRI layer includes two injector Silicon-Rich-Nitride layers that sandwich the porous antifuse dielectric layer.

These and other aspects, embodiments, advantages, and features will become apparent from the following description of the invention and the referenced drawings.

BRIEF DESCRIPTION OF THE DRAWINGS

FIGS. 10A–10F illustrate a portion of a silicon substrate undertaking a sequence of steps for single sphere-shaped empty space formation.

FIGS. 11A–11C illustrate a portion of a silicon substrate undertaking a sequence of steps for single pipe-shaped empty space formation.

FIGS. 12A–12B illustrate a portion of a silicon substrate undertaking a sequence of steps for plate-shaped empty space formation.

DETAILED DESCRIPTION OF THE INVENTION

Figure 1A:
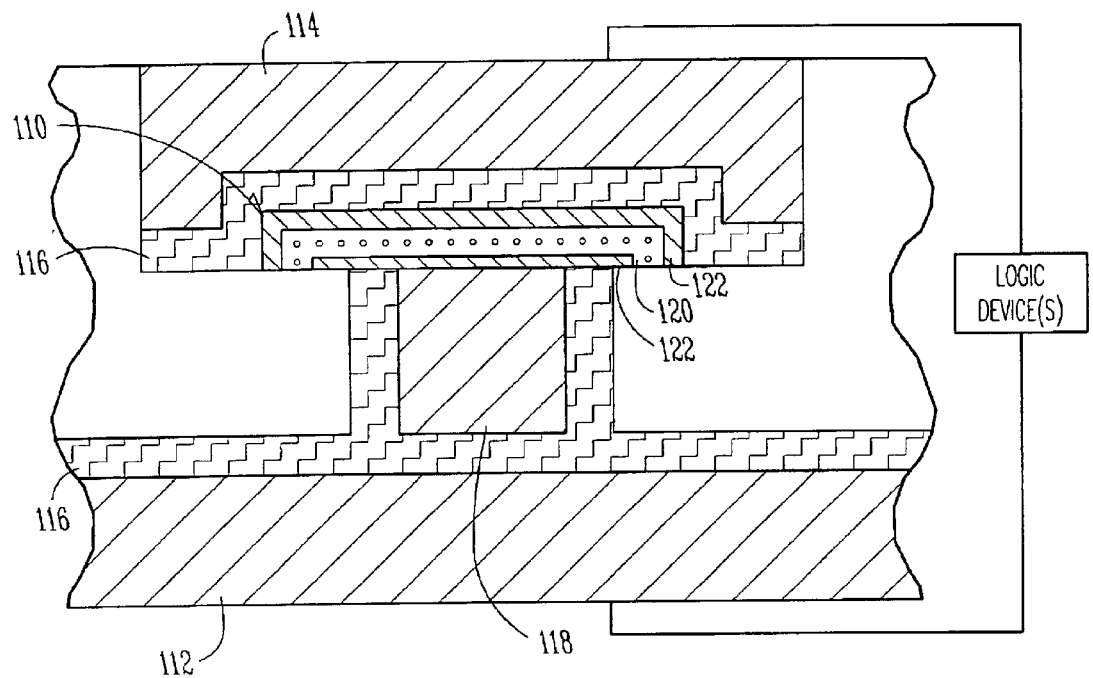
FIG. 1 illustrates one antifuse structure embodiment in which an antifuse dielectric is sandwiched between two layers of injector SRN.

The following detailed description of the invention refers to the accompanying drawings which show, by way of illustration, specific aspects and embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The present subject matter provides a scalable high-performance antifuse structure and process by providing a low-k dielectric medium with a controlled porosity as the core element of the antifuse structure, and by integrating the core element with an injector silicon-rich insulator (SRI) such as injector silicon-rich nitride (injector SRN) or injector silicon-rich oxide (injector SRO), which are discussed below. The result of the integration is an antifuse that has a very low capacitance and a uniform dielectric breakdown, and that is operable with a significantly reduced programming voltage.

The low-k dielectric medium is provided with a lower effective dielectric constant ($k_{eff}$) by incorporating a controlled amount of air (k=1) or voids, also referred to as micro or nano-voids, into an otherwise inorganic or organic low-k dielectric medium. In various embodiments, for example, voids are formed in $SiO_2$ (k≈3.6) and lead acetate (k≈2.6) to provide an even lower $k_{eff}$. A uniform breakdown strength of nearly 3 MV/cm is capable of being provided in one embodiment in which the dielectric medium is sandwiched between upper and lower layers of injector SRN. One embodiment of the antifuse structure has a $k_{eff}$ value of around 1.5–1.6, and reduces the capacitance and programming voltage by a factor of 2.5× with respect to the capacitance and programming voltage of known antifuses.

Figure 1B:
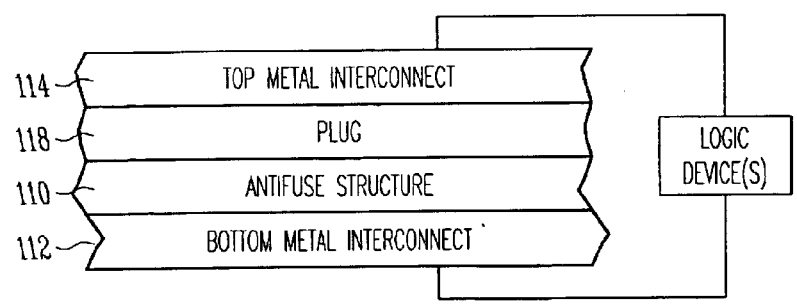

FIG. 1 illustrates one antifuse structure embodiment in which an antifuse dielectric is sandwiched between two layers of injector SRN. The antifuse structure 110 is positioned between a bottom metal interconnect line 112 and a top metal interconnect line 114. According to various embodiments, these metal lines 112 and 114 are capable of being formed from Aluminum (Al), Copper (Cu) or Tungsten (W). A thin etch-stop barrier interface layer 116 lines the metal interconnect lines 112 and 114. According to various embodiments, the etch-stop barrier interface layer 116 is Titanium/Titanium Nitride (Ti/TiN) or Tantalum/Tantalum Nitride (Ta/TaN). The bottom metal interconnect line 112 is connected to the antifuse structure 110 through a stud 118 in a via hole. According to various embodiments, the stud includes Tungsten (W) or Copper (Cu). The stud 118 also is lined by an etch-stop barrier interface layer 116.

The antifuse structure 110 is positioned either between the plug 118 and the top metal interconnect line 114, as shown, or between the plug 118 and the bottom metal interconnect 112 (not shown). The antifuse structure 110 generally includes an antifuse dielectric or core element 120, such as a porous oxide, which is sandwiched between two layers of injector SRN 122 in one embodiment of the invention. The injector SRN 122 provides a uniform and somewhat reduced breakdown for the porous-oxide without significantly adding the capacitance of the composite structure as well as chemical passivation layers to aid process integration.

According to one embodiment, a top layer and a bottom layer of SRN are used to sandwich the antifuse dielectric. According to one embodiment, only a bottom layer of SRN is used, wherein the antifuse dielectric is deposited on the bottom layer of SRN. In one embodiment, only a top layer of SRN is used and deposited on the top layer of SRN. In one embodiment of the antifuse structure, the antifuse dielectric includes porous oxide. In one antifuse structure embodiment, the SRN layer or layers are 1 to 2 nm thick and the porous oxide layer is about 4 to 8 nm thick. Other embodiments include injector SRO as an injector SRI.

Table 1 illustrates the characteristics for the illustrated antifuse that are potentially realized as compared to known antifuses. There are major improvements in reducing breakdown strength, reducing the associated programming voltage (Vp), improving the uniformity of the programming voltage, and reducing the parasitic capacitance associated with the antifuse.

TABLE 1

COMPARISON OF CHARACTERISTICS OF
PRESENT ANTIFUSE AND KNOWN ANTIFUSES

| | Known Antifuses | Present Invention |
|---|---|---|
| Dielectric Constant (K) | ≧4 | ~1.5 |
| Break Down Strength | 6–10 × 10$^6$ V/CM | 3–4 × 10$^6$ V/CM |
| $C_{OFF}$ (Off Capacitance) | ~5 fF/u2 | ~1.9 fF/u2 |
| $R_{ON}$ (On Resistance) | ~10 Ohm | <5 Ohm |
| $T_{ox.eq.}$ | ~10 nm | 5–10 nm |
| Pulse Programming $V_P$ | ~10 Volts | 2–4 Volts |
| $V_P$ Uniformity | ∓30% | ∓5% |
| Dielectric Material | ONO or Amorphous Si | SRN/Porous SiO$_2$/SRN |

One embodiment of an antifuse structure is shown in FIG. 1. The injector SRN will be discussed in more detail below with respect to FIGS. 2–4 and the porous dielectric will be discussed in more detail below with respect to FIGS. 5–12.

Figure 2:
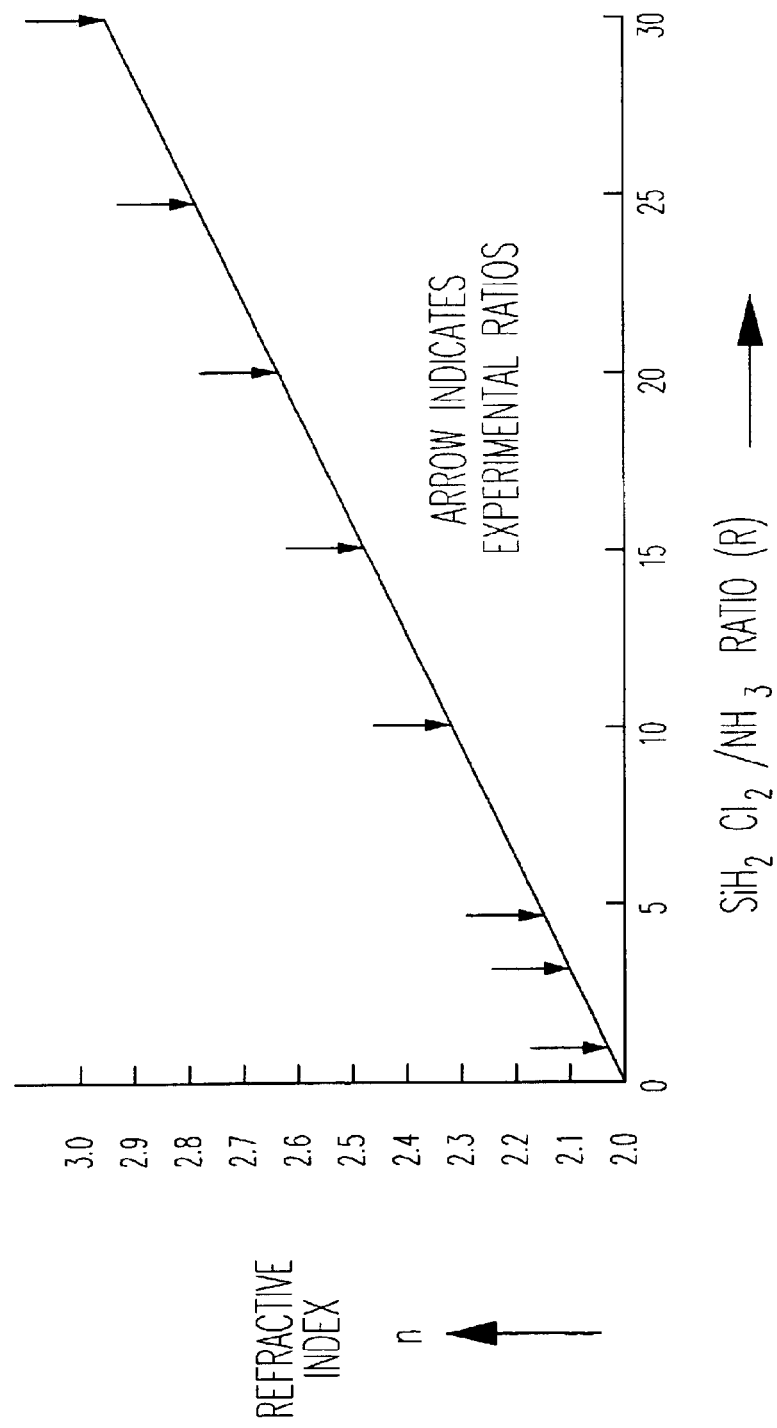
FIG. 2 is a graph showing refractive index of silicon-rich silicon nitride films versus $SiH_2Cl_2/NH_3$ flow rate ratio.
Figure 3:
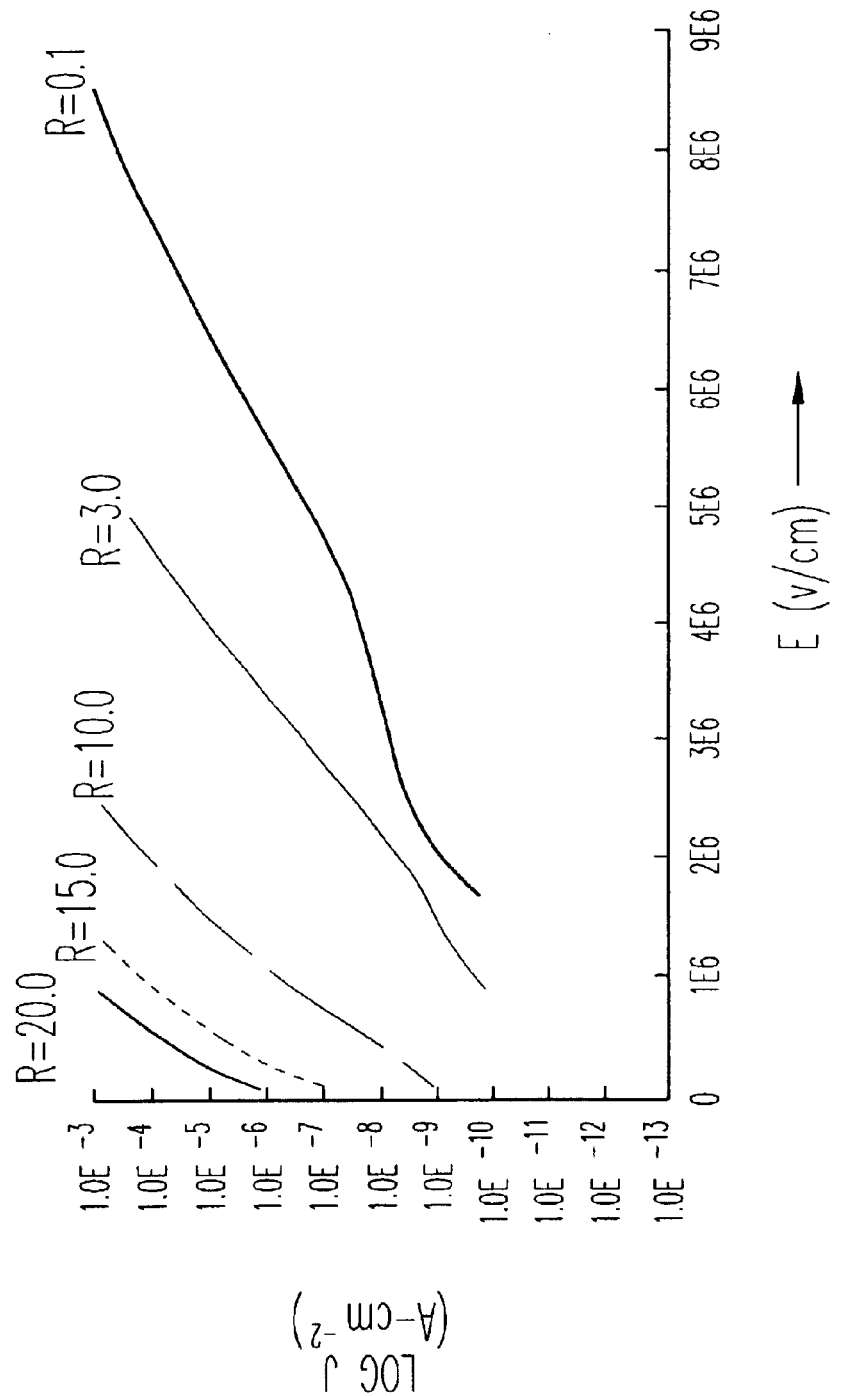
FIG. 3 is a graph showing current density versus applied field for silicon-rich silicon nitride films having different percentages of excess silicon.
Figure 4:
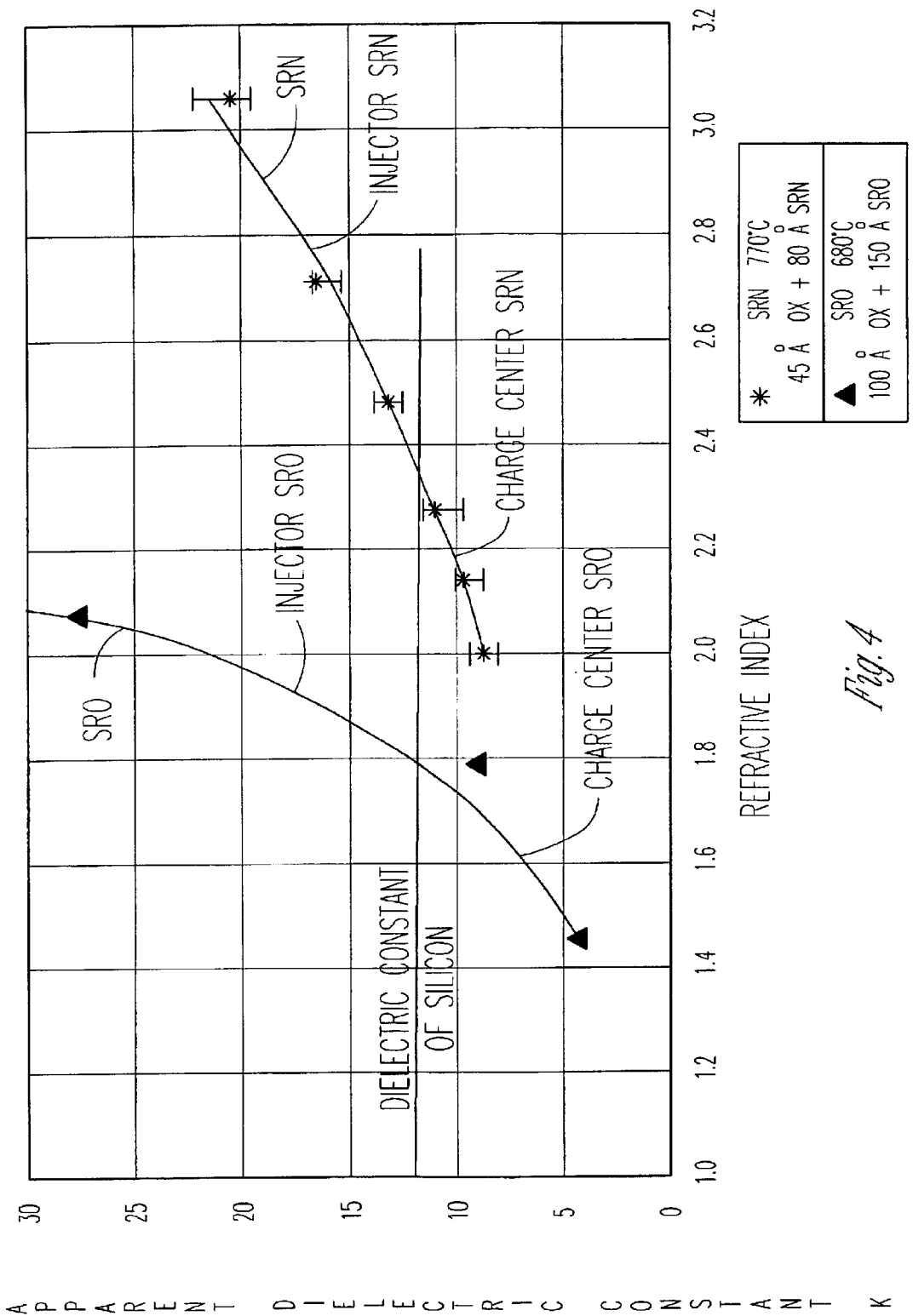
FIG. 4 is a graph showing apparent dielectric constant k versus refractive index for both silicon rich nitride (SRN) and silicon rich oxide (SRO).

Silicon-rich nitride (SRN), or more particularly, injector SRN was referenced in the Background of the Invention. SRN is a subset of silicon rich insulator (SRI). Another subset of SRI is silicon rich oxide (SRO), or more particularly, injector SRO. FIGS. 2–4, described below, are included to elaborate on the characteristics of SRN, including injector SRI.

FIG. 2 is a graph showing refractive index of silicon-rich silicon nitride films versus $SiH_2Cl_2/NH_3$ flow rate ratio (R). This figure is provided herein to illustrate the known relationship between the silicon amount, as provided by the flow rate ratio (R), and the refractive index in the film. The graph indicates that the index of refraction increases linearly with increasing silicon content. As such, the index of refraction (n) of the films can be used as an indication of the silicon content of the films.

FIG. 3 is a graph showing current density versus applied field for silicon-rich silicon nitride films having different percentages of excess silicon. The current density (J) is represented in amperes/cm$^2$, and log J is plotted against the electric field E (volts/cm) for $Si_3N_4$ layers having a $SiH_2Cl_2/NH_3$ flow rate ratio R of 0.1, 3.0, 10.0, 15.0 and 20.0. This figure is provided herein to illustrate the known relationship between the amount of silicon and the conductivity of the film. The plot shows that the $Si_3N_4$ layers having small additions of silicon (flow rate ratio R=3) exhibit a relatively small conductivity increase over stoichiometric $Si_3N_4$. The plot further shows that increasing silicon content at or above the flow rate ratio R=10 substantially increases or enhances the conductivity.

Silicon-rich nitride (SRN) films having an R greater than 10 (or, more specifically, having an index of refraction greater than 2.3) are referred to as an injector SRN medium. A silicon-rich $Si_3N_4$ injector (injector SRN) provides appreciably enhanced charge conductance without providing significant charge trapping similar to the characteristics of semi-metals.

Silicon nitride injectors (injector SRN) are preferred over silicon oxide injectors (injector SRO) because the two-phase nature of the former is believed to be structurally more stable at elevated processing temperature. Furthermore, SRN is chemically passive against chemical solutions as well as an effective barrier against n or p type dopant diffusion; that is, against phosphorus or boron respectively.

FIG. 4 is a graph showing apparent dielectric constant k versus refractive index for both silicon rich nitride (SRN) and silicon rich oxide (SRO). The SRN and SRO plotted in this graph were provided using a Low Pressure Chemical Vapor Deposition (LPCVD) process. The SRO was fabricated at approximately 680° C., and the fabricated structure included 100 Å oxide and 150 Å SRO. The SRN was fabricated at approximately 770° C., and the fabricated structure included 45 Å oxide and 80 Å SRO. As shown in the graph, the dielectric constant of silicon is around 12. Materials with a higher k than silicon are conventionally termed a high k material, and materials with a lower k than silicon are conventionally termed a low k material. Injector SRN are those that have a refractive index of 2.5 or greater and injector SRO are those that have a refractive index of 1.85 or greater. Injector SRN and injector SRO have apparent dielectric constants that are greater than 12. Injector SRI includes both high k SRO and high k SRN.

Figure 5:
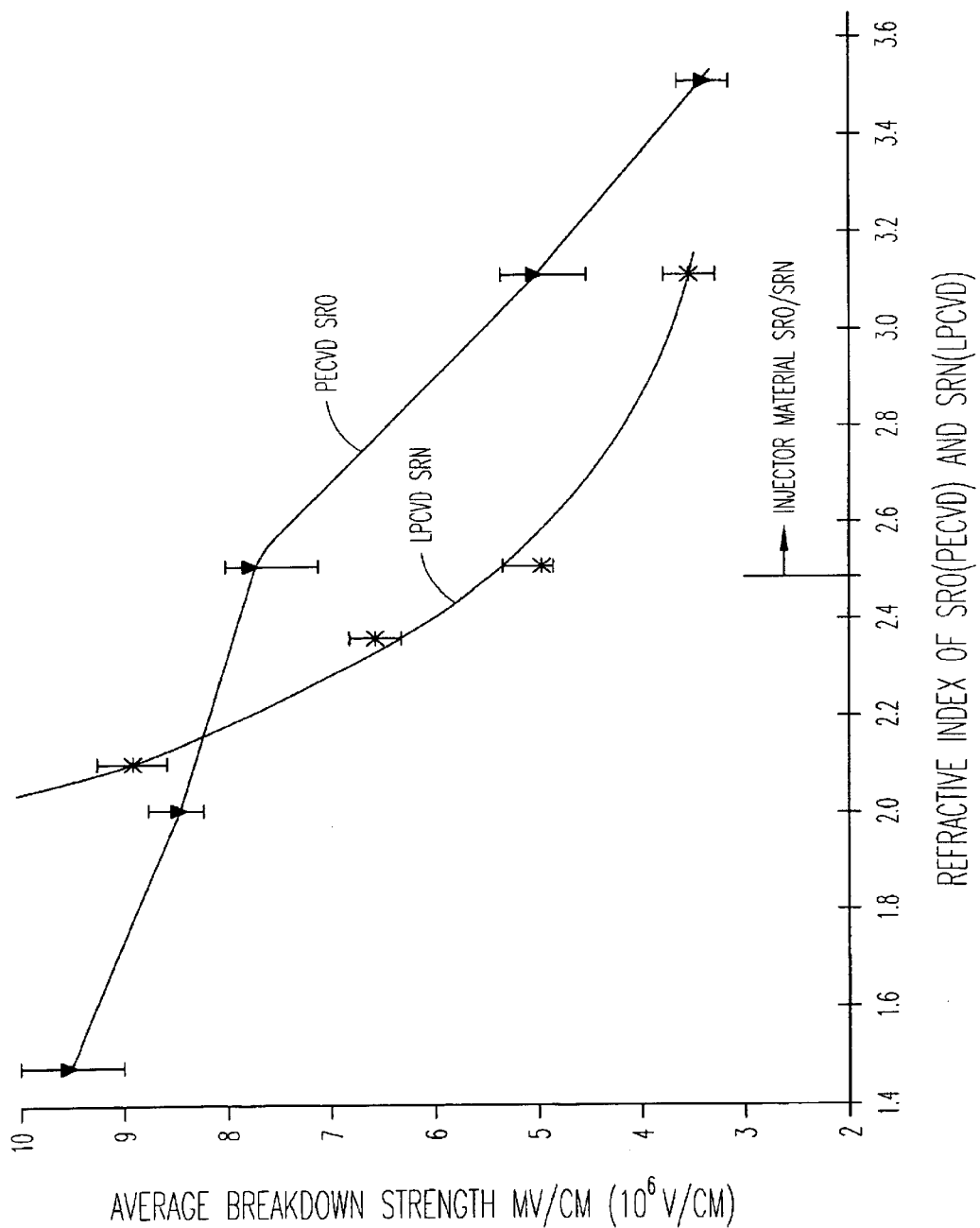
FIG. 5 illustrates the relationship between the average breakdown strength of oxide/silicon rich insulator (SRI) (i.e. either SRO or SRN) composite versus refractive index of SRO and SRN.

FIG. 5 illustrates the relationship between the average breakdown strength of oxide/silicon rich insulator (SRI) (i.e. either SRO or SRN) composite versus refractive index of SRO and SRN. Two graphs provide the relationships of average breakdown strength of composite oxide-SRO and oxide-SRN structures versus the respective refractive index of SRO (PCVD) and SRN (LPCVD). The average breakdown strength of the composite is progressively reduced with increasing silicon content of either SRO or SRN in the composite. When injector SRO or injector SRN is used in oxide/SRI composite (refractive index>2.5), breakdown strength of the composite is reduced to 50% or lower than that of the oxide. Additionally, as mentioned earlier, injector SRO or SRN provides uniform carrier injection and enhanced conduction which provides uniform breakdown.

It was mentioned above that injector SRN is integrated with the core element of the antifuse structure. The incorporation of injector SRN or SRO enhances uniform charge injection and conduction such that a lower programming voltage can be used to fuse an antifuse without significantly increasing the capacitance of the antifuse.

Figure 6:
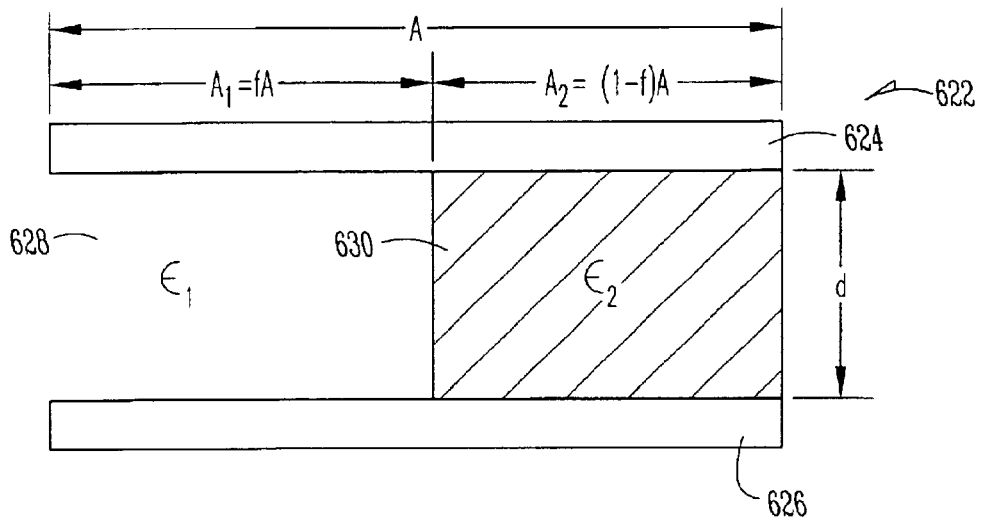
FIG. 6 illustrates a parallel capacitor model for two distinct dielectrics in parallel with each other, the first dielectric having a permittivity of $\in_1$, or a permittivity of free space ($\in_0$), and the second dielectric having a permittivity of $\in_2$.
Figure 7:
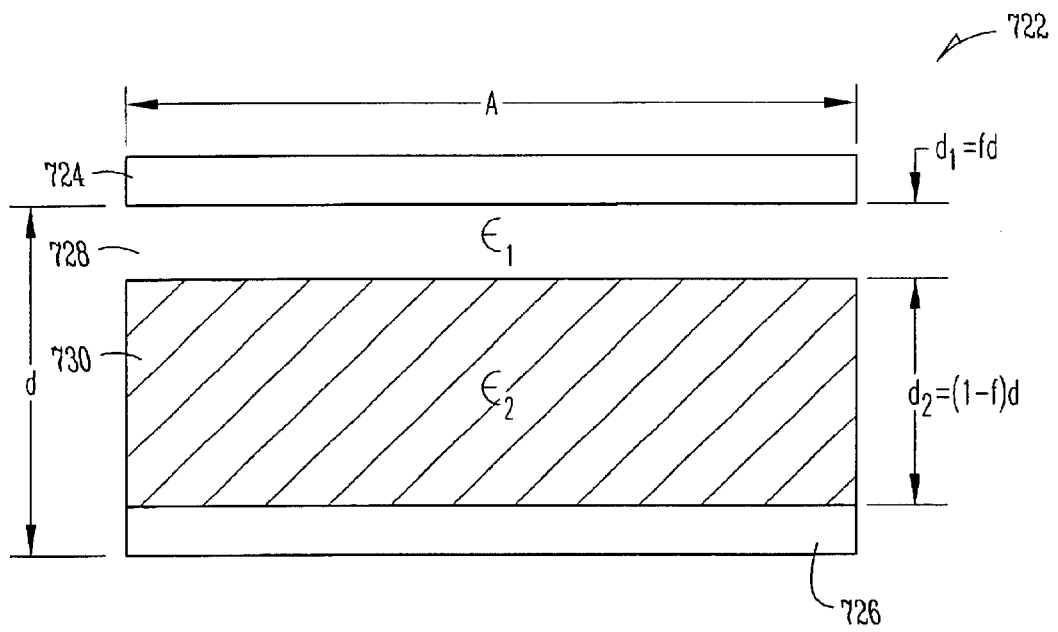
FIG. 7 illustrates a series capacitor model for two distinct dielectrics in series with each other, the first dielectric having a permittivity of $\in_1$, or a permittivity of free space ($\in_0$), and the second dielectric having a permittivity of $\in_2$.

In addition to providing uniform and lower breakdown voltage (i.e. fusing voltage), the present subject matter significantly lowers the dielectric constant (k) of the core element by incorporating or forming voids or air gaps in a solid structure of a low-k material. FIGS. 6 and 7, described below, illustrate a parallel and a series capacitor model, as well as their effective dielectric constant ($k_{eff}$).

FIG. 6 illustrates a parallel capacitor model for two distinct dielectrics in parallel with each other, the first dielectric having a permittivity of $\in_1$, or a permittivity of free space ($\in_0$), and the second dielectric having a permittivity of $\in_2$. The capacitor 622 has a first electrode 624 and a second electrode 626. The first electrode 624 and the second electrode 626 both have a length (A) and are separated by a distance (d). A first dielectric 628 is formed between the first and second electrodes, and a second dielectric 630 is formed between the first and second electrodes and parallel to the first dielectric. The first dielectric extends a distance $A_1$, which is a fraction of the length A, from one end of the electrodes as provided by the following equation:

$$A_1 = f \times A. \tag{1}$$

The variable f represents the fraction (or filling factor) of the first dielectric 628, which is air (k≈1) in one embodiment. The second dielectric 630 extends a distance $A_2$, which is a fraction of the length A, from the opposing end of the electrodes as provided by the following equation:

$$A_2 = A - A_1 = (1-f) \times A. \tag{2}$$

The effective dielectric constant ($\lambda_{eff(P)}$) for the parallel capacitor model is represented by the following equation:

$$k_{eff(P)} = f + k_2 \times (1-f) \tag{3}$$

FIG. 7 illustrates a series capacitor model for two distinct dielectrics in series with each other, the first dielectric having a permittivity of $\in_1$, or a permittivity of free space ($\in_0$), and the second dielectric having a permittivity of $\in_2$. The capacitor 722 has a first electrode 724 and a second electrode 726. The first electrode 724 and the second electrode 726 both have a length (A) and are separated by a distance (d). A first dielectric 728 is formed in series with a second dielectric 730 between the first and second electrodes. The first dielectric 728 has a width $d_1$, which is a fraction of the distance d as represented by the following equation:

$$d_1 = f \times d. \tag{4}$$

The variable f represents the fraction (or filling factor) of the first dielectric 728, which is air (k≈1) in one embodiment. The second dielectric has a width $d_2$, which is fraction of the distance d as represented by the following equation:

$$d_2 = d - d_1 = (1-f) \times d. \tag{5}$$

The effective dielectric constant ($k_{eff(S)}$) for the series capacitor model is represented by the following equation:

$$k_{eff(S)} = \frac{1}{f + (1-f) \times \frac{1}{k_2}}. \tag{6}$$

Figure 8:
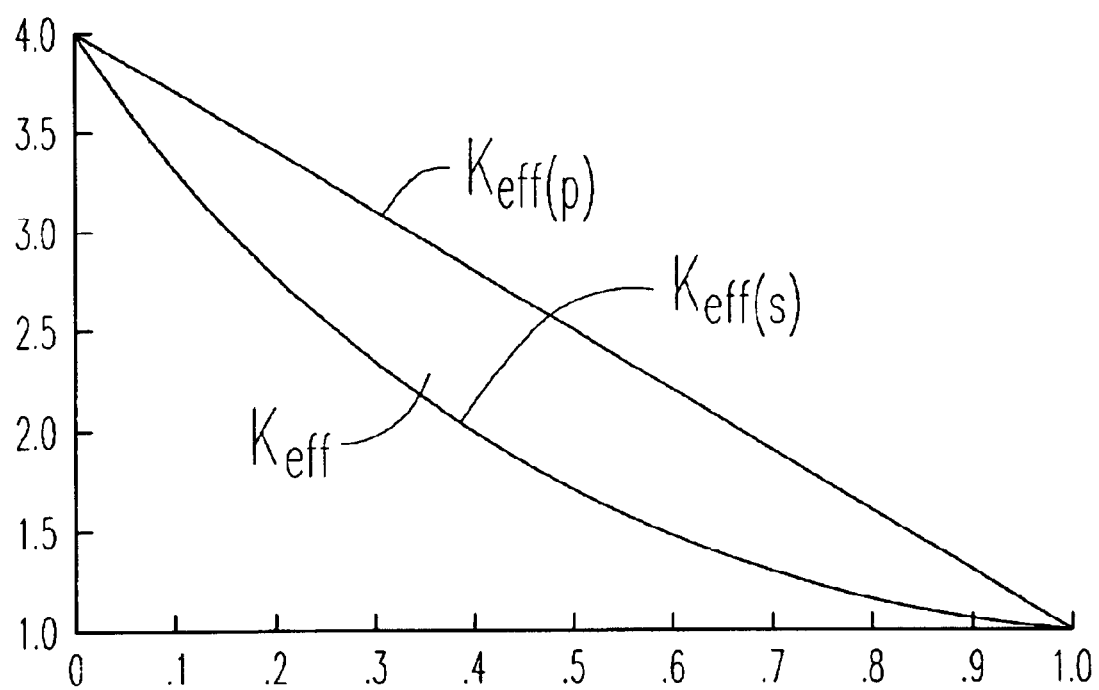
FIG. 8 illustrates plots of $k_{eff(P)}$ (P for parallel) and $k_{eff(S)}$ (S for series) which are plotted as a function of the filling factor "f", which is shown in FIGS. 5 and 6, and for $k_2$ equal to 4.0.

FIG. 8 illustrates plots of $k_{eff(P)}$ and $k_{eff(S)}$ which are each plotted as a function of the filling factor variable "f" and for $k_2$ equal to 4.0. One of ordinary skill in the art will recognize that similar plots can be made for other dielectric constant values. The effective dielectric constant ($k_{eff}$) of a material of dielectric constant $k_2$ with embedded empty spaces depends on the detailed size, shape orientation and spacing of the empty spaces relative to a set of parallel electrodes. However, the $k_{eff}$ for the material with a dielectric constant $k_2$ with embedded empty spaces is bounded between the effective capacitance for the parallel capacitor model ($k_{eff(P)}$) and the effective capacitance of the series capacitor model ($k_{eff(S)}$).

There are a number of methods for forming a porous dielectric. Four of these methods include forming Spin-On-Glass Hydrogen Silisesquioxane (SOG-HSQ) such as Nanoglass, Aerogels, and Xerogels; forming empty spaces using surface transformation; defining holes within a dielectric with a mold and sealing or covering the holes with the dielectric to form the void, and defining holes within a dielectric using an electrochemical process and sealing or covering the holes with the dielectric to form the void.

Figure 9:
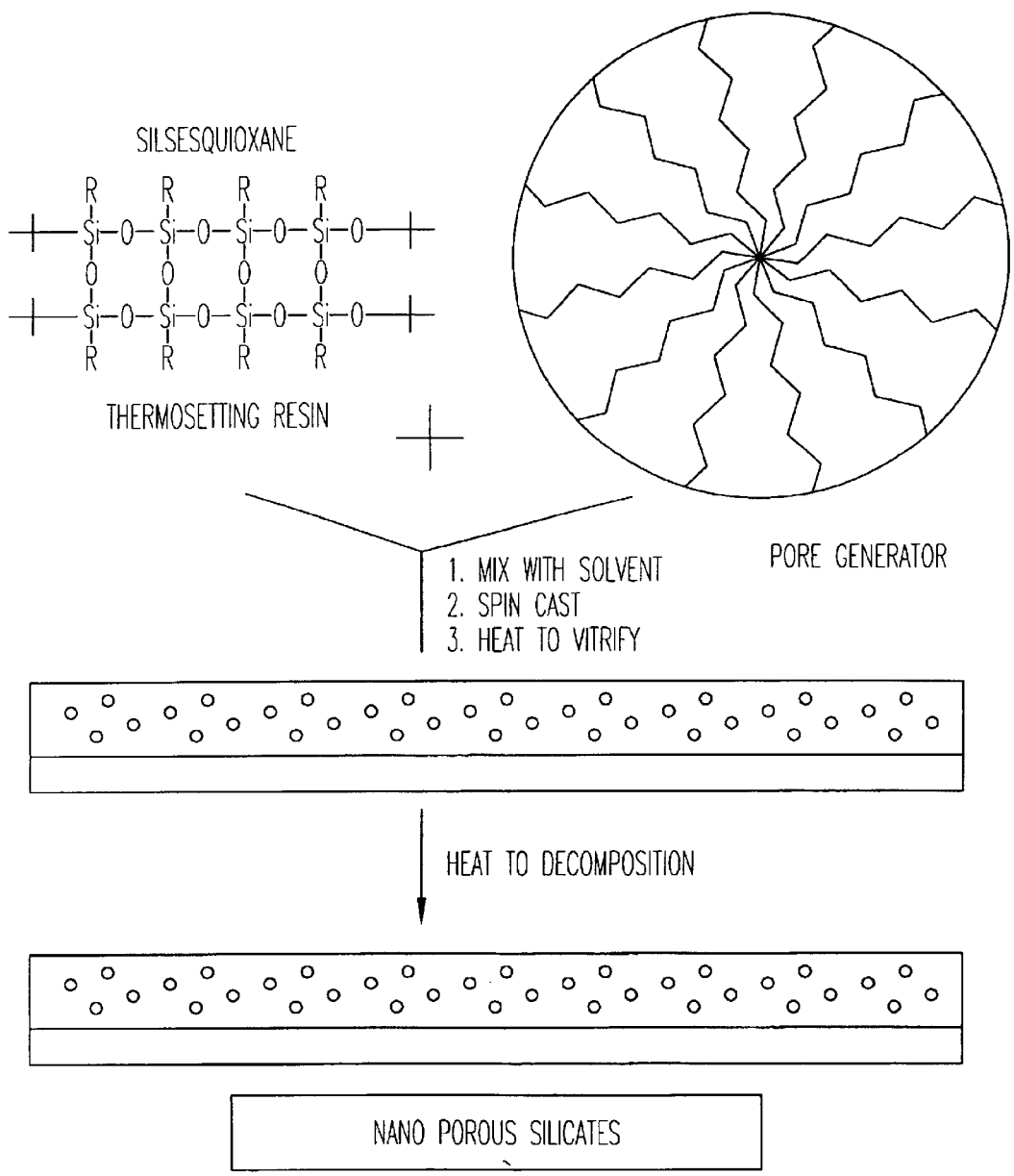
FIG. 9 illustrates a Xerogel process for forming porous, silica-based material with a lower dielectric constant (k).

FIG. 9 illustrates a Xerogel process for forming porous, silica-based material with a lower dielectric constant (k). Xerogels are one type of SOG-HSQ. Other types of SOG-HSQ include Nanoglass and Aerogels. SOG-HSQ based on silica incorporate a large amount of air in voids, such that dielectric constants of 1.95 and lower have been achieved with voids that are as small as 5–10 nm. Zhang et al., *Nanoglass™ E Copper Damascene Processing for Etch, Clean, and CMP*, Proceeding of IITC, IEEE, Jun. 4–6, 2001, San Francisco, pp. 57–59 is a reference that relates to Nanoglass. Treichel, *Low Dielectric Constant Materials*, J. of Electronic Materials, Vol 30, No. 4, April 2001, pp 290–298 is a reference that relates to Xerogels and Aerogels.

Another method for forming a porous dielectric involves controllably forming empty spaces using surface transformation. The empty spaces reduces the effective dielectric constant ($k_{eff}$) of the insulator, and are controllably formed using surface transformation. Empty spaces formed from surface transformation are analyzed in more detail below.

As analyzed by Nichols et al. (F. A. Nichols et al., Trans. AIME 233, (10), p 1840, 1965) when a solid is heated to a higher temperature, a solid with a cylindrical hole that is beyond a critical length ($\lambda_c$) becomes unstable. The cylindrical hole is transformed into one or more empty spheres formed along the cylinder axis. The number (N) of spheres formed depends on the length (L) and radius ($R_C$) of the cylinder. Two models of diffusion are surface diffusion and pure volume diffusion. With respect to surface diffusion, for example, the relation between the cylinder length (L), cylinder radius ($R_C$), and number of spheres (N) is expressed by the following equation:

$$8.89 \times R_C \times N \leq L < 8.89 \times R_C \times (N+1). \tag{7}$$

Equation (7) predicts that no empty spheres will form if $L < 8.89 \times R_C$. Each empty sphere that forms has a radius ($R_S$) expressed by the following equation:

$$R_S = 1.88 \times R_C. \tag{8}$$

If the cylinder has sufficient length L to form two spheres, the center-to-center spacing between the spheres corresponds to the critical length ($\lambda_C$) and is provided by the equation:

$$\lambda_C = 8.89 \times R_C. \tag{9}$$

Pure volume diffusion provides similar results, with slightly different constants. For example, depending on the exact magnitude of the diffusion parameters, $\lambda_C$ can vary from $9.02 \times R_C$ to $12.96 \times R_C$. One of ordinary skill in the art will understand that the diffusion model is capable of being determined by experiment. The remainder of this disclosure assumes surface diffusion. One of ordinary skill in the art will understand, upon reading and comprehending this disclosure, how to apply the teachings of the present invention to another diffusion model.

As analyzed by Sato et al. (T. Sato et al., VLSI Dig., p206, 1998), a deep trench in silicon, which has a melting temperature of 1400° C., is transformed into empty spheres along the axis of the original trench at a reducing ambient of 10 Torr of hydrogen and an annealing temperature of 1100° C. The empty spheres are uniformly sized and spaced.

As analyzed by Sato et al. (T. Sato et al., 1999 IEDM Digest, paper 20.6.1), various shaped empty spaces such as spheres, pipes, and plates are capable of being formed under the surface of a silicon substrate. The shape of the empty spaces formed during the annealing conditions depends on the size, number and spacing of the cylindrical holes that are initially formed at a lower temperature.

FIGS. 10A–10F illustrate a portion of a silicon substrate undertaking a sequence of steps for single sphere-shaped empty space formation. A cylindrical hole 1010 is formed in the surface 1012 of a volume of a solid material 1014. As used here, the term hole refers to a void defined by the solid material. The material 1014 is heated (annealed) and undergoes the transformation illustrated in FIGS. 10B through 10F. The result of the surface transformation process is an empty sphere formed below the surface 1012 of the volume of material 1014.

In order to form a single sphere, which holds true for forming a single pipe or plate, the length (L) and radius ($R_C$) of the cylindrical holes are chosen such that equation (7) with N=1 is satisfied. It is pointed out that a vertical stacking of N empty spaces results if the length of the cylindrical holes is such that equation (7) is satisfied.

In order for single surface-transformed spheres to combine with other surface-transformed spheres, the center-to-center spacing ($D_{NT}$) between the initial cylindrical holes will satisfy the following equation:

$$2 \times R_C < D_{NT} < 3.76 \times R_C. \tag{10}$$

Satisfying this equation prevents the adjacent initial cylindrical holes from touching, yet allows the adjacent surface-transformed spheres to combine and form pipe and plate empty spaces, as shown in FIGS. 11A–11C and FIGS. 12A–12B and described below.

FIGS. 11A–11C illustrate a portion of a silicon substrate undertaking a sequence of steps for single pipe-shaped empty space formation. A linear array of cylindrical holes 1110 is formed in a surface 1112 of a solid material 1114. The cylindrical holes 1110 have a center-to-center spacing ($D_{NT}$) as calculated using equation (4). The material 1114 is heated (annealed) and undergoes the transformation illustrated in FIGS. 11B through 11C. The result of the surface transformation process is an empty pipe-shaped void 1118 formed below the surface 1112 of the volume of material 1114. The radius ($R_P$) of the pipe 1118 is provided by the following equation:

$$R_P = \sqrt{\frac{8.86 \times R_C^3}{D_{NT}}}. \tag{11}$$

FIGS. 12A–12B illustrate a portion of a silicon substrate undertaking a sequence of steps for plate-shaped empty space formation. A two-dimensional array of cylindrical holes 1210 is formed in a surface 1212 of a solid material 1214. The cylindrical holes 1210 have a center-to-center spacing ($D_{NT}$) as calculated using equation (10). The material 1214 is heated (annealed) and undergoes the transformation illustrated in FIG. 12B. The result of the surface transformation process is an empty plate-shaped void 1220 formed below the surface 1212 of the volume of material 1214. The thickness ($T_P$) of a plate 1220 is given by the following equation:

$$T_P = \frac{27.83 \times R_C^3}{D_{NT}^2} \tag{12}$$

The present subject matter forms low-k materials using surface transformation. That is, the present subject matter incorporates surface transformation formed empty spaces to lower the effective dielectric ($k_{eff}$) of an insulator. The size, shape and spacing of empty spaces is controlled by the diameter, depth and spacing of cylindrical holes initially formed in a solid dielectric material that has a defined melting temperature. Empty spaces or voids are formed after annealing below the defined melting temperature. The empty spaces or voids are capable of being formed with a spherical, pipe, or plate shape, or combinations of these shapes.

The surface transformed empty spaces do not provide additional stress or produce a tendency to crack because the volume of air incorporated in the surface transformed empty spaces is equal to the volume of air within the initial starting pattern of cylindrical holes. It is noted that if the cylinder length (L) is equal to an integer of a critical length ($\lambda_C$) such as 1×$\lambda_C$ to form one sphere, 2×$\lambda_C$ to form two spheres, 3×$\lambda_C$ to form three spheres, etc., then the surface will be smooth after the surface transformed empty spaces are formed. However, if the cylinder length (L) is not equal to an integer of a critical length ($\lambda_C$), then the surface will have dimples caused by air in the cylinder attributable to the length beyond an integer of a critical length ($\lambda_C$). That is, for a given length L and $\lambda_C$, the number of spheres formed is the integer of L/$\lambda_C$, and the remainder of L/$\lambda_C$ contributes to the dimples on the surface.

Figure 13A:
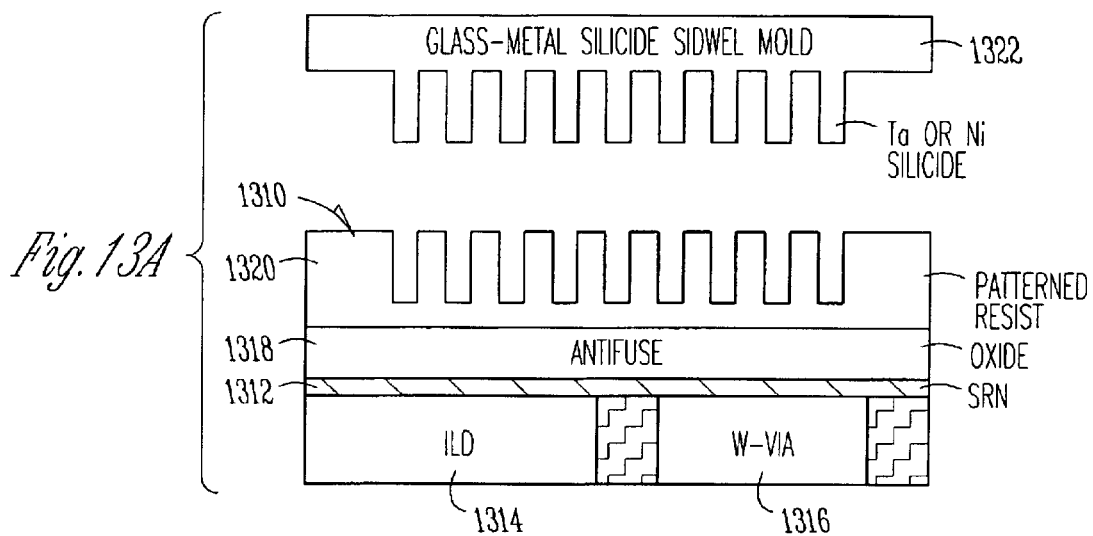
FIGS. 13A–13C illustrate a Silicon Direct Write Electron Beam Lithography (SiDWEL) nano-imprint air gap process for nano-void formation.
Figure 13B:
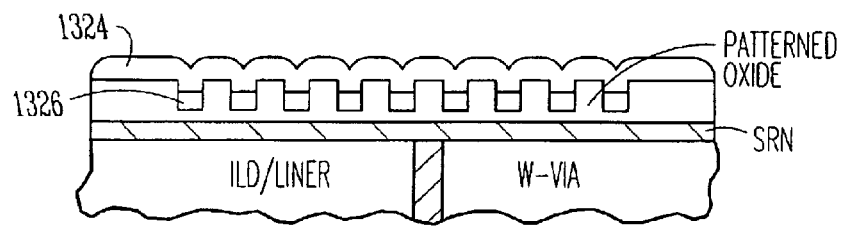
Figure 13C:
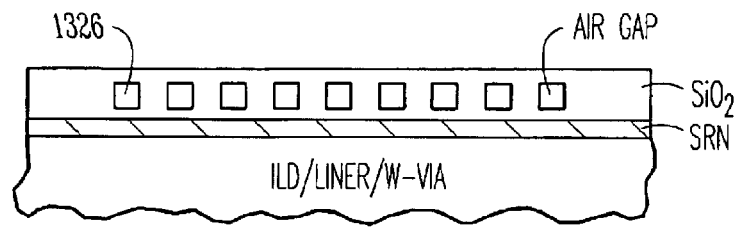

FIGS. 13A–13C illustrate a Silicon Direct Write Electron Beam Lithography (SiDWEL) nano-imprint air gap process for nano-void formation. FIG. 13A illustrates an antifuse 1310 that includes a layer of injector SRN 1312 on an interlevel dielectric 1314 and a tungsten (W) via plug 1316. A solid structure of antifuse dielectric material 1318, such as $SiO_2$, is formed on the injector SRN layer 1312. A pattern resist layer 1320 is deposited on the antifuse dielectric layer.

In one embodiment, a glass-metal silicide SiDWEL mold 1322 is used to imprint a pattern of nano-impressions into the pattern resist layer. One embodiment of the mold 1322 includes Tantalum Silicide and another embodiment of the mold includes Nickel Silicide.

A reactive ion etching (RIE) process is performed in one embodiment to form a pattern of holes in the antifuse dielectric material that corresponds to the patterned resist layer. RIE has a chemical and physical basis that is capable of providing a controlled anisotropic etching and selectivity with respect to removing materials underlying the masking material. As such, RIE is useful for forming high aspect holes. The resist layer is removed from the antifuse dielectric material after the RIE process, leaving behind the antifuse dielectric material with a pattern of holes etched therein to provide air gaps in the antifuse dielectric material.

As shown in FIG. 13B, additional antifuse dielectric material 1324 is overlaid on the antifuse dielectric material that is patterned with holes. The overlaid material has poor step coverage, such that the overlaid material seals over the pattern of holes and forms air gaps 1326 in the antifuse dielectric. In one embodiment, the antifuse dielectric material is $SiO_2$, and the overlayer of $SiO_2$ is deposited using a Plasma Enhanced Chemical Vapor Deposition (PECVD) process.

The antifuse dielectric material is planarized, such as that performed using a Chemical Mechanical Polishing process. The result is the structure shown in FIG. 13C, which illustrates an antifuse dielectric that has a controlled amount of air gaps formed therein. The size and pattern of the air gaps, and thus the filling factor of air in the composite air/$SiO_2$ dielectric material is determined by the imprinted pattern from the mold, the depth of the etch performed by the RIE process into the antifuse dielectric material, and the step coverage for the overlayer of the antifuse dielectric deposited using the PECVD process.

Another method for forming a porous dielectric involves defining holes within a dielectric using an electrochemical process and sealing or covering the holes with the dielectric to form the void. As analyzed by B. A. Das (B. A. Das, "Template Based Semiconductor Nanostructure Fabrication and Their Application", Invited Paper, 11th International Workshop in the Physics of Semiconductor Devices, paper D.1.1, Dec. 11–15, 2001, New Delhi, India), nano-voids are capable of being fabricated using an appropriate electrochemical anodization process of reactive metals under predetermined conditions. In this process, a reactive metal film is anodized to completion to form metal oxide. Nano-voids of controlled geometry are capable of being formed along with the resulting metal-oxide by using a predetermined temperature and current density, and further by using a predetermined electrolyte (i.e. acid solution). Thin aluminum films have been deposited both on silicon substrate as well as on silicon/platinum substrate. These aluminum films have been deposited both by sputtering and by e-beam evaporation. The aluminum films were subsequently anodized in a sulphuric acid ($H_2SO_4$) bath at 3 degrees centigrade using a platinum cathode and the silicon substrate as the counter electrode (i.e. anode). The complete oxidation (i.e. anodization) of the aluminum film results in a structure that has a high aspect ratio array of nano-voids surrounded by alumina ($Al_2O_3$). The nano geometry is capable of being tailored from 4 nm to 50 nm in diameter by controlling the film thickness and electrochemical process parameters. The present invention makes use of this process to form a porous antifuse dielectric as described below with respect to FIGS. 14A–14C.

Figure 14A:
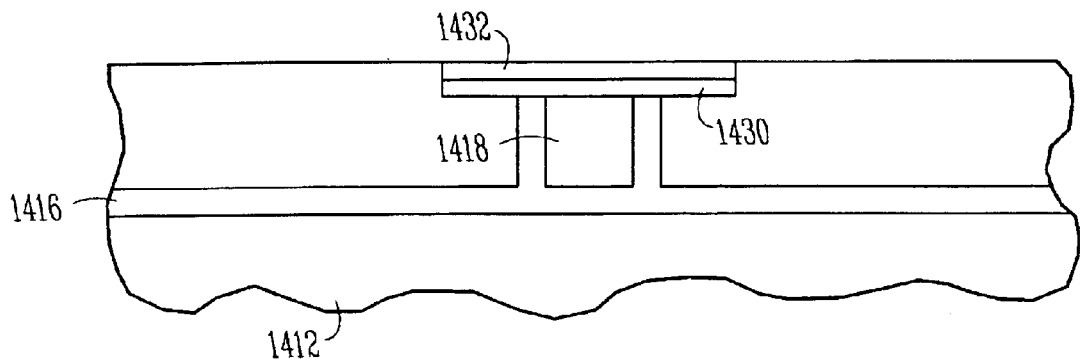
FIGS. 14A–14C illustrate an electrochemical process of nano-void formation.
Figure 14B:
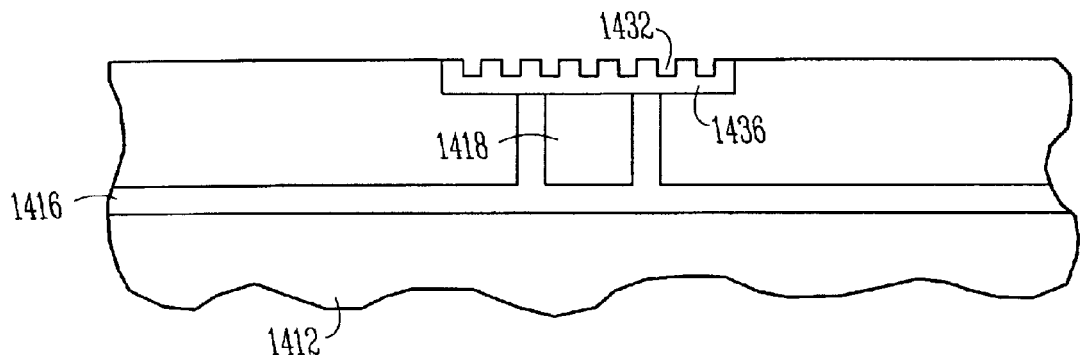
Figure 14C:
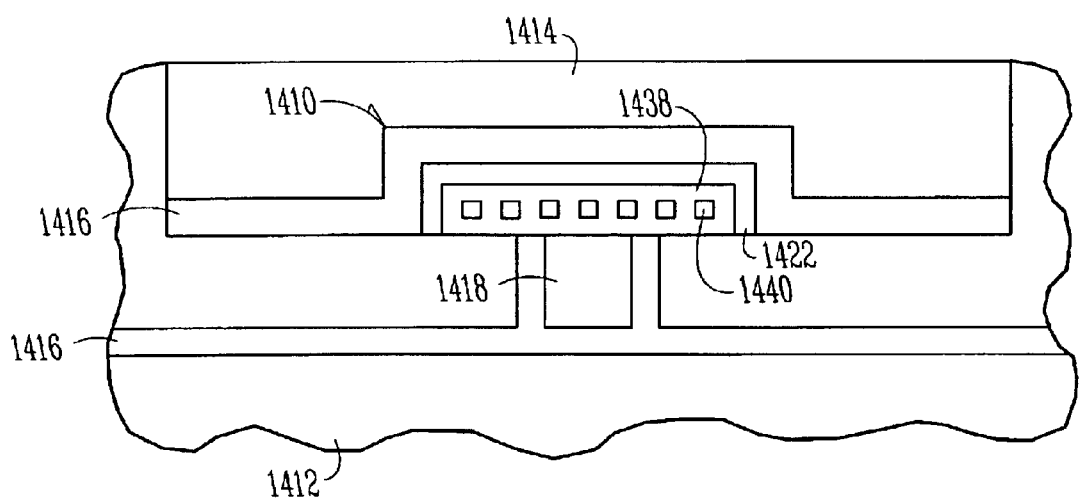

FIGS. 14A–14C illustrate an electrochemical process of nano-void formation. A barrier metal layer 1416, such as Titanium/Titanium Nitride (Ti/TiN) or Tantalum/Tantalum Nitride (Ta/TaN), is formed over a lower level metal 1412. A stud 1418 is formed in a via hole over the barrier metal layer 1416. The barrier metal layer 1416 surrounds the sides and bottom of the stud 1418. In one embodiment, a thin layer of porous silica 1430 (such as Xerogel) and a thin film overlayer of reactive metal 1432 are fabricated on top of the interlevel via stud 1418 as shown in FIG. 14A. In one embodiment, the porous silica 1430 is deposited using a SOG-HSQ technique as previously described with respect to FIG. 9. In one embodiment, the thin reactive metal film includes aluminum. In one embodiment, the thin reactive metal film includes aluminum copper. According to one embodiment, the reactive metal film is deposited using conventional sputtering; and according to another embodiment, the reactive metal film is deposited using e-beam evaporation. Using the lower level interconnect metal 1412 as a counter-electrode, the reactive metal 1432 is electrochemically anodized in an acidic electrolyte to form a dielectric insulator with nano-sized holes 1434 on a thin base of silica ($SiO_2$) 1436. One embodiment uses a platinum electrode for the anodization process. According to one embodiment in which the thin reactive metal film includes aluminum, the anodization process forms alumina ($Al_2O_3$) on a thin base of $SiO_2$, and also forms holes (or pores) within the $Al_2O_3$ as generally illustrated in FIG. 14B. One process embodiment includes annealing the device after the anodization process to stabilize the structure. An additional antifuse dielectric material 1438 with poor step coverage is deposited to seal the nano-sized holes to form nano-voids 1440, which is similar to the process illustrated in FIG. 13B with respect to the SiDWEL process. The device is planarized using a chemical mechanical polish (CMP) process for example, and an overlayer of injector SRN 1422 is deposited to complete the antifuse structure as illustrated in FIG. 14C. As one of ordinary skill in the art will understand upon reading and comprehending this disclosure, the formation of barrier layers 1416 and the top interconnection level 1414 follows as standard interconnect layer processing.

Figure 15:
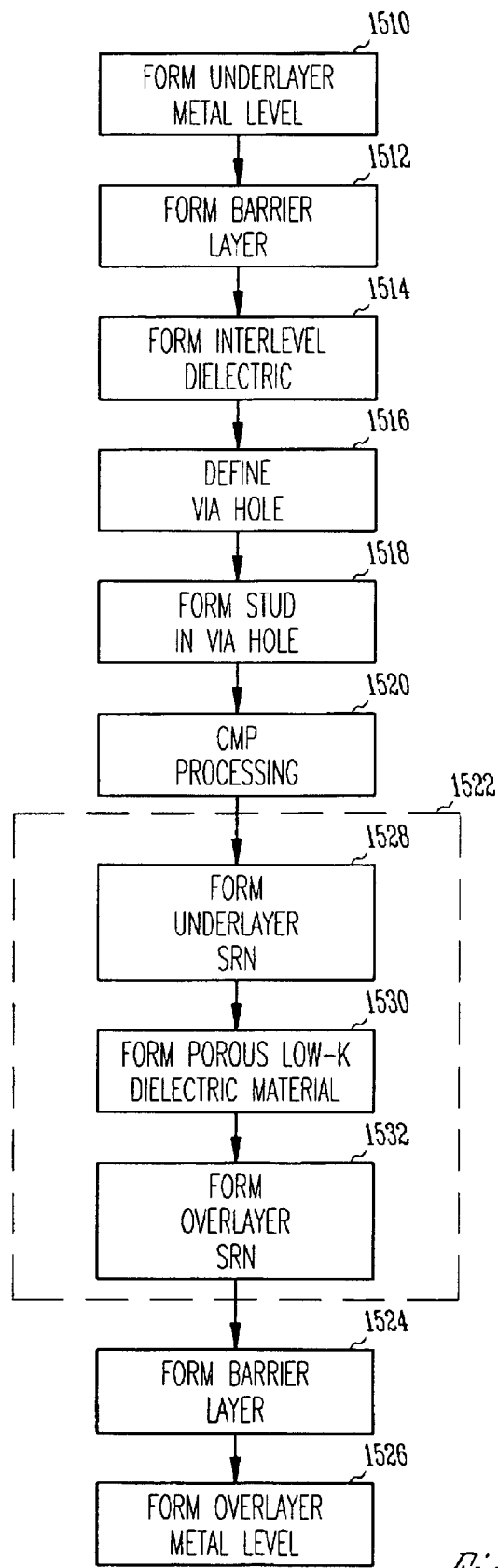
FIG. 15 illustrates the overall process flow of one embodiment for forming an antifuse structure.

FIG. 15 illustrates one embodiment for forming an antifuse structure. That antifuse structure is electrically coupled to an underlayer metal, which is formed at 1510. The underlayer metal is formed in one embodiment using standard back-end-of line fabrication and patterning. A barrier level is formed at 1512 on the underlayer metal level. In one embodiment, the barrier layer includes Ti/TiN. In another embodiment, the barrier layer includes Ta/TaN. At 1514, an interlevel dielectric is formed on the barrier layer. A via hole is defined within the interlevel dielectric at 1516. At 1518, a plug or stud, is formed within the via hole that was defined in the interlevel dielectric. A chemical mechanical polishing (CMP) process is performed at 1520 to planarize or prepare a surface of the interlevel dielectric and the stud for receiving the antifuse structure. The antifuse structure is formed at 1522. Various embodiments for forming the antifuse structure are discussed below. A barrier layer is formed on the antifuse structure at 1524. An overlayer metal level is formed at 1526 according to standard processing techniques.

In one two-SRN level embodiment, forming the antifuse structure 1522 includes forming an underlayer SRN layer at 1528, forming a porous low-k dielectric material on the underlayer SRN 1530, and forming an overlayer SRN layer on the porous low-k dielectric material 1532. In this method embodiment, the underlayer SRN layer is formed on the via stud since the antifuse structure is formed above the via stud. However, one of ordinary skill in the art will understand that the process steps are capable of being performed in another order to form the antifuse structure below the via stud. In that case, the overlayer SRN layer is in contact with the via stud. In one embodiment, the SRN level deposited and defined using a low-temperature Plasma Enhanced Chemical Vapor Deposition (PECVD) process. In other method embodiments, only the underlayer SRN layer or the overlay SRN layer is formed for a one-SRN level antifuse structure. Various embodiments for forming the porous low-k dielectric material is discussed below.

Figure 16:
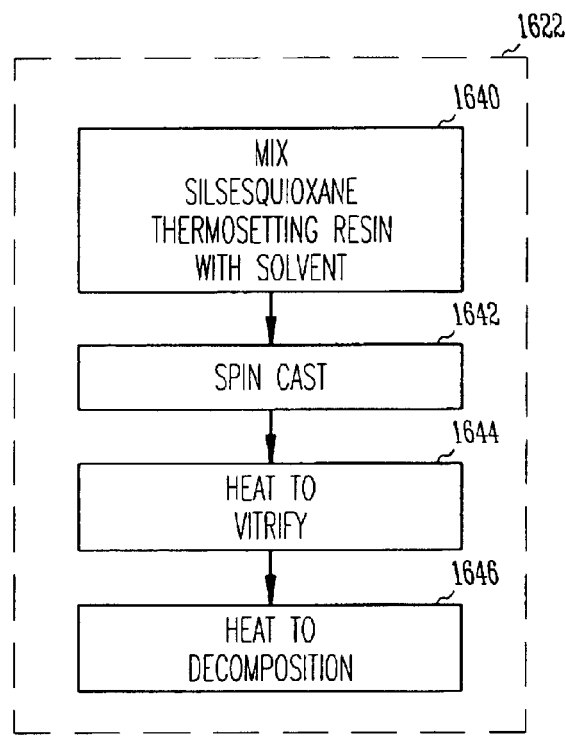
FIG. 16 illustrates one Spin-On-Glass Hydrogen Silisesquioxane (SOG-HSQ) embodiment of process flow, and in particular a Xerogel example, for forming a porous low-k dielectric material.

FIG. 16 illustrates one SOG-HSQ embodiment, and in particular a Xerogel example, for forming a porous low-k dielectric material. The illustrated method generally corresponds to forming the antifuse structure 1522 in FIG. 15. According to this method, the SOG-HSQ method includes mixing silsesquioxane thermosetting resin with solvent at 1640. The mixture is spin cast at 1642. The mixture is heated to vitrify the mixture at 1644, and is heated to decomposition at 1646.

The figures presented and described in detail above are similarly useful in describing the method aspects of the present subject matter. The methods described below are nonexclusive as other methods may be understood from the specification and the figures described above.

Figure 17:
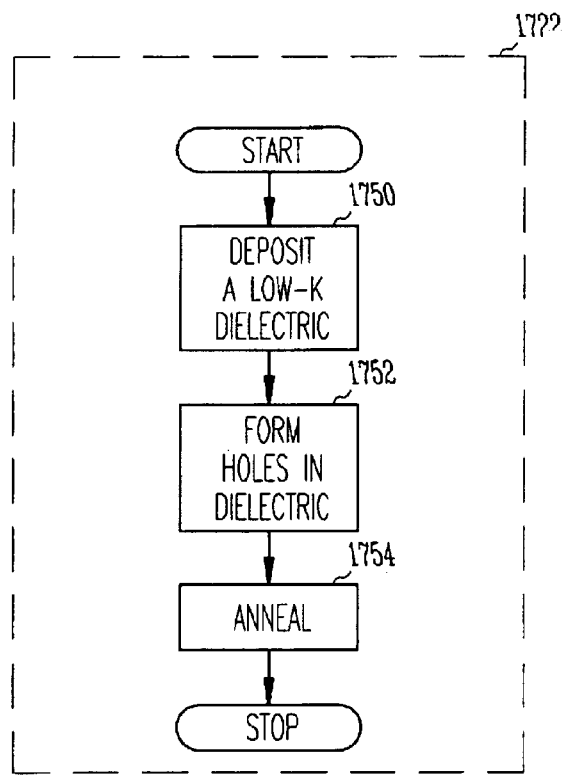
FIG. 17 illustrates one embodiment of process flow for forming a porous low-k dielectric material by forming empty spaces using surface transformation.

FIG. 17 illustrates one embodiment for forming a porous low-k dielectric material by forming empty spaces using surface transformation. The illustrated method generally corresponds to forming the antifuse structure 1522 in FIG. 15. According to one embodiment, a low-k dielectric is deposited at 1750. Holes are formed in the low-k dielectric at 1752. At 1754, the low-k dielectric material is annealed to cause surface transformation. The result of the surface transformation is that the holes that were previously formed in the low-k dielectric are transformed into empty spaces under the surface of the dielectric. These empty spaces lower the effective dielectric constant. Furthermore, the use of the surface transformation technique allows the spaces to be arranged in such a manner as to maximize the amount of void space in the dielectric to minimize the effective dielectric constant. It is noted that a goal is to pack as much air in the dielectric volume because increasing the filling factor (f) of air decreases the effective dielectric constant ($k_{eff}$) of the dielectric volume. In one embodiment of the present invention, the diameter of the voids within the dielectric volume ranges from 1 micron to 0.2 micron. This range is capable of being characterized using a number of subranges. Other ranges are anticipated.

It is possible to define the pattern using direct write e-beam lithography, but this is an expensive and time consuming process. A dense pattern of holes is all that is required to reduce the dielectric constant and the associated capacitive loading effects. Various techniques are available to form the holes in the solid material. One technique is imprint lithography. It may be desired to imprint the mask twice with an random offset of the mask between the printings in order to achieve a high density of holes. Another technique is to form a stencil using a method described by Asoh et al. (H. Asoh et al., "Fabrication of Ideally Ordered Anodic Porous Alumina with 3 nm Hole Periodicity Using Sulfuric Acid", J. Vac. Technol., B 19(2), March/April 2001, pp. 569–572) by first producing a metal mask that can be used repeatedly.

Continuing with the example, once the insulator has been patterned and holes are etched, the surface is heated rapidly to a temperature near the melting point of the insulator and the surface transformation of cylindrical holes to buried empty spaces takes place. The heating is accomplished by using a pulsed incoherent light or laser source that is applied for a few microseconds to a few milliseconds, thereby only heating the uppermost layer of the wafer. The wafer is rapidly cooled after the heat source is extinguished by the large thermal mass of the wafer.

Figure 18:
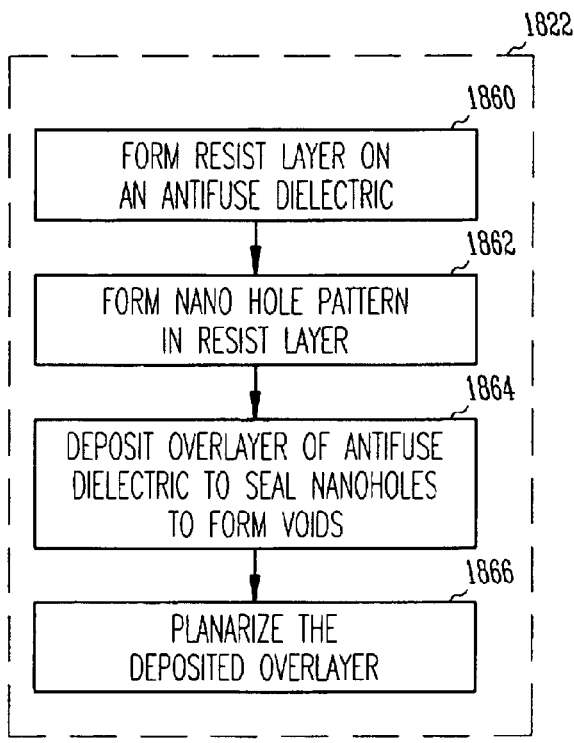
FIG. 18 illustrates one embodiment of process flow for forming a porous low-k dielectric material using nano-imprint lithography and a silicide mold (SiDWEL) process.

FIG. 18 illustrates one embodiment for forming a porous low-k dielectric material using nano-imprint lithography and a silicide mold (SiDWEL) process. According to this method, a resist layer is formed on an antifuse dielectric at 1860, and a nano hole pattern is formed in the resist layer at 1862. Again, it may be desired to imprint the mask twice with an random offset of the mask between the printings in order to achieve a high density of holes. At 1864, an overlayer of the antifuse dielectrics is deposited to seal the nano holes to form a controlled array of nano air-gap structures or voids. The deposited overlay layer is planarized at 1866 to prepare the resulting porous dielectric material for additional processing.

In one embodiment, the nano hole pattern is formed in the resist layer at 1862 using nano-imprint lithography and a SiDWEL process. An example of this process has been shown and described with respect to FIGS. 13A through 13C. In one embodiment, the overlay layer of antifuse dielectric is deposited on the antifuse dielectric using a Plasma Enhanced Chemical Vapor Deposition (PECVD) process.

Figure 19:
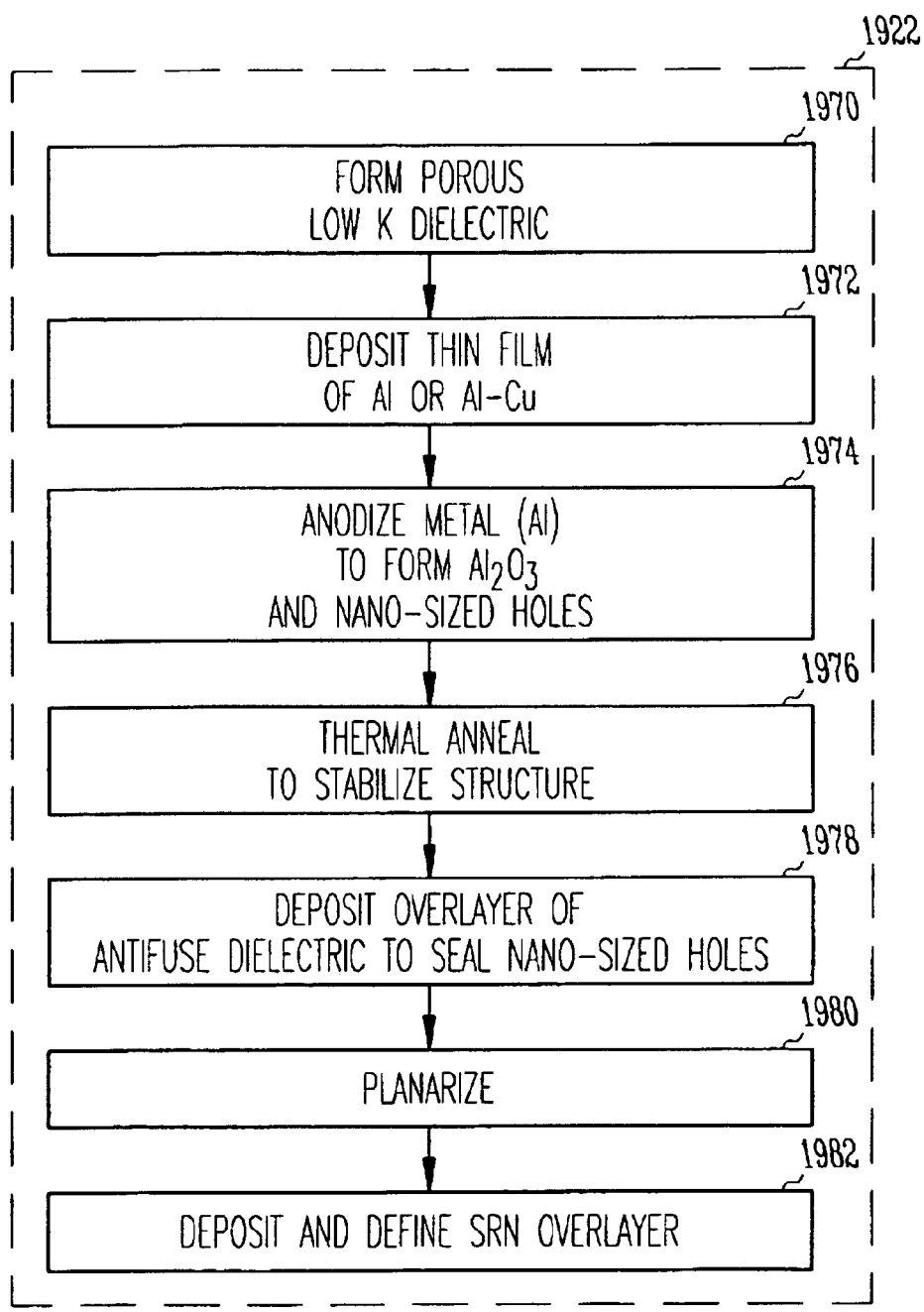
FIG. 19 illustrates one embodiment of process flow for forming porous low-k dielectric material using an electrochemical process of nano-void formation.

FIG. 19 illustrates one embodiment of process flow for forming porous low-k dielectric material using an electrochemical process of nano-void formation. According to this method, a porous low-k dielectric is formed at 1970. In one embodiment, a porous silica is deposited using a SOG-HSQ technique. A thin reactive metal film is deposited on the low-k dielectric at 1972. In one embodiment, the reactive metal film includes aluminum. In one embodiment, the reactive metal film includes aluminum-copper. The thin reactive metal film is anodized at 1974 such that, in an embodiment in which the reactive metal film includes aluminum, the anodization of the aluminum results in alumina ($Al_2O_3$) with nano-sized holes or pores. In one embodiment, the device undergoes a thermal anneal process at 1976 to stabilize the structure. At 1978, an overlayer of antifuse dielectric that has poor step coverage is deposited to seal the nano-sized holes or pores. The device is planarized at 1980. An SRN overlayer is deposited on the planarized surface and defined at 1982.

Figure 20:
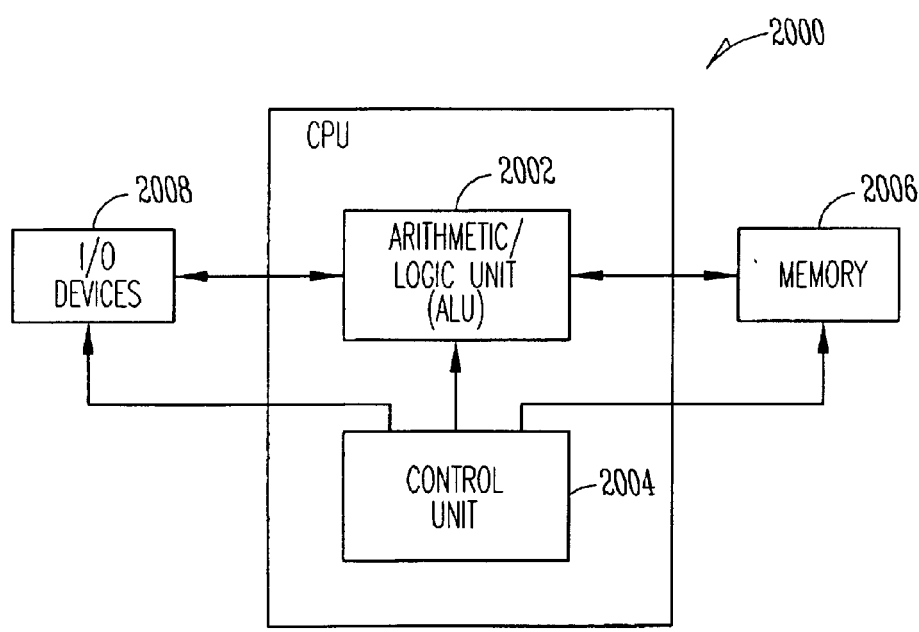
FIG. 20 is a simplified block diagram of a high-level organization of an electronic system according to the teachings of the present invention.

FIG. 20 is a simplified block diagram of a high-level organization of an electronic system according to the teachings of the present invention. The electronic system 2000 has functional elements, including a processor or arithmetic/logic unit (ALU) 2002, a control unit 2004, a memory device unit 2006 and an input/output (I/O) device 2008. Generally such an electronic system 2000 will have a native set of instructions that specify operations to be performed on data by the processor 2002 and other interactions between the processor 2002, the memory device unit 2006 and the I/O devices 2008. The control unit 2004 coordinates all operations of the processor 2002, the memory device 2006 and the I/O devices 2008 by continuously cycling through a set of operations that cause instructions to be fetched from the memory device 2006 and executed. In one embodiment, the processor 2002 and control unit 2004, for example, are formed as or include Field Programmable Gate Arrays (FPGAs) or Alterable Logic Devices (ALDs) which include scalable high performance antifuse structures according to the teachings of the present invention. These antifuse structures improve performance of the entire electronic system 2000 by reducing the RC component attributable to the antifuse structure, and by scaling the programming voltage for the antifuse structures with Vdd. In one embodiment, the programming voltage is less than 2×Vdd, such that simpler circuitry is used to provide the programming voltage on-chip.

CONCLUSION

The present subject matter provides a scalable high-performance antifuse structure and process by providing a low-k dielectric medium with a controlled porosity as the core element of the antifuse structure, and by integrating the core element with an injector silicon-rich insulator (SRI) such as injector silicon-rich nitride (injector SRN). The resulting antifuse has a very low capacitance, a uniform dielectric breakdown, and is operable with a significantly reduced programming voltage. As such, the resulting antifuse is capable of being used in high performance applications.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An antifuse device positioned between a first metal level and a second metal level for an integrated circuit, comprising:
   a porous antifuse dielectric layer; and
   at least one injector Silicon-Rich-Insulator (SRI) layer in contact with the porous antifuse dielectric layer.

2. The antifuse device of claim 1, wherein:
   the at least one injector SRI layer includes two injector SRI layers; and
   the porous antifuse dielectric layer is sandwiched between the two injector SRI layers.

3. The antifuse device of claim 1, wherein the at least one injector SRI layer is positioned between the first metal level and the porous antifuse dielectric layer.

4. The antifuse device of claim 1, wherein the at least one injector SRI layer is positioned between the second metal level and the porous antifuse dielectric layer.

5. The antifuse device of claim 1, wherein the porous antifuse dielectric layer includes voids formed using a Spin-On-Glass Hydrogen Silisesquioxane (SOG-HSQ) method.

6. The antifuse device of claim 1, wherein the porous antifuse dielectric layer includes voids formed using surface transformation.

7. The antifuse device of claim 1, wherein the porous antifuse dielectric layer includes voids formed by imprinting a pattern of nano-impressions into a pattern resist layer, performing a reactive ion etching (RIE) process, and overlaying the pattern of nano-impressions using an antifuse dielectric that has poor step coverage.

8. The antifuse device of claim 1, wherein the porous antifuse dielectric layer includes voids formed by an electro-mechanical process of nano-void formation.

9. The antifuse device of claim 1, wherein the at least one SRI layer includes at least one SRO layer.

10. An antifuse device positioned between a first metal level and a second metal level for an integrated circuit, comprising:
    a porous antifuse dielectric layer; and
    at least one injector Silicon-Rich-Nitride (SRN) layer in contact with the porous antifuse dielectric layer.

11. The antifuse device of claim 10, wherein the thickness of the at least one SRN layer is within a range between 1 to 2 nm thick.

12. The antifuse device of claim 10, wherein the porous antifuse dielectric layer includes a porous $SiO_2$ layer.

13. The antifuse device of claim 12, wherein the porous $SiO_2$ layer is within a range between 4 to 8 nm thick.

14. The antifuse device of claim 10, wherein the porous antifuse dielectric layer includes a porous lead acetate layer.

15. An antifuse device positioned between a first metal level and a second metal level for an integrated circuit, comprising:
    a porous antifuse dielectric layer; and
    two injector Silicon-Rich-Nitride (SRN) layers in contact with the porous antifuse dielectric layer, wherein the two injector SRN layers sandwich the porous antifuse structure.

16. The antifuse device of claim 15, wherein the thickness of each of the SRN layers is within a range between 1 to 2 nm thick.

17. The antifuse device of claim 15, wherein the porous antifuse dielectric layer includes a porous $SiO_2$ layer.

18. The antifuse device of claim 17, wherein the porous $SiO_2$ layer is within a range between 4 to 8 nm thick.

19. The antifuse device of claim 15, wherein the porous antifuse dielectric layer includes a porous lead acetate layer.

20. An antifuse device positioned between a first metal level and a second metal level for an integrated circuit, comprising:
    a porous $SiO_2$ layer within a range between 4 to 8 nm thick; and
    two injector Silicon-Rich-Nitride (SRN) layers in contact with the porous $SiO_2$ layer, wherein the two injector SRN layers sandwich the porous $SiO_2$ layer, and wherein each of the two injector SRN layers is within a range between 1 to 2 nm thick.

21. The antifuse device of claim 20, wherein the porous $SiO_2$ layer includes voids formed using a Spin-On-Glass Hydrogen Silisesquioxane (SOG-HSQ) method.

22. The antifuse device of claim 20, wherein the porous $SiO_2$ layer includes voids formed using surface transformation.

23. The antifuse device of claim 20, wherein the porous $SiO_2$ layer includes voids formed by imprinting a pattern of nano-impressions into a pattern resist layer, performing a reactive ion etching (RIE) process, and overlaying the pattern of nano-impressions using an antifuse dielectric that has poor step coverage.

24. A programmable integrated circuit, comprising:
    an upper metal level connected to at least one logic device;
    a lower metal level connected to the at least one logic device; and
    an antifuse coupled between the upper metal level and the lower metal level, the antifuse including:
    a porous antifuse dielectric layer; and
    at least one injector Silicon-Rich-Insulator (SRI) layer in contact with the porous antifuse dielectric layer.

25. The programmable integrated circuit of claim 24, wherein:
    the at least one injector SRI layer includes two injector SRI layers; and
    the porous antifuse dielectric layer is sandwiched between the two injector SRI layers.

26. The programmable integrated circuit of claim 24, wherein the at least one injector SRI layer is positioned between the first metal level and the porous antifuse dielectric layer.

27. The programmable integrated circuit of claim 24, wherein the at least one injector SRI layer is positioned between the second metal level and the porous antifuse dielectric.

28. The programmable integrated circuit of claim 24, wherein the porous antifuse dielectric layer includes voids formed using a Spin-On-Glass Hydrogen Silisesquioxane (SOG-HSQ) method.

29. The programmable integrated circuit of claim 24, wherein the porous antifuse dielectric layer includes voids formed using surface transformation.

30. The programmable integrated circuit of claim 24, wherein the porous antifuse dielectric layer includes voids formed by imprinting a pattern of nano-impressions into a pattern resist layer, performing a reactive ion etching (RIE) process, and overlaying the pattern of nano-impressions using an antifuse dielectric that has poor step coverage.

31. The programmable integrated circuit of claim 24, wherein the porous antifuse dielectric layer includes voids formed by an electro-mechanical process performed on a porous silica layer and an aluminum-containing layer on the porous silica layer such that the porous antifuse dielectric layer includes alumina ($Al_2O_3$) on a thin base of silicon dioxide ($SiO_2$), wherein the alumina includes the voids.

32. The programmable integrated circuit of claim 24, wherein the at least one SRI layer includes at least one SRO layer.

33. A programmable integrated circuit, comprising:
    at least one logic device;
    an upper metal level connected to the at least one logic device;
    a lower metal level connected to the at least one logic device; and
    an antifuse coupled between the upper metal level and the lower metal level to program a function of the at least one logic device upon the application of a fusing voltage, the antifuse including:
        a porous antifuse dielectric layer; and
        at least one injector Silicon-Rich-Nitride (SRN) layer in contact with the porous antifuse dielectric layer.

34. The programmable integrated circuit of claim 33, wherein the thickness of the at least one SRN layer is within a range between 1 to 2 nm thick.

35. The programmable integrated circuit of claim 33, wherein the porous antifuse dielectric layer includes a porous $SiO_2$ layer.

36. The programmable integrated circuit of claim 35, wherein the porous $SiO_2$ layer is within a range between 4 to 8 nm thick.

37. The programmable integrated circuit of claim 33, wherein the porous antifuse dielectric layer includes a porous lead acetate layer.

38. A programmable integrated circuit, comprising:
    at least one logic device;
    an upper metal level connected to the at least one logic device;
    a lower metal level connected to the at least one logic device; and
    an antifuse coupled between the upper metal level and the lower metal level to program a function of the at least one logic device, the antifuse including:
        a porous $SiO_2$ layer within a range between 4 to 8 nm thick; and
        two injector Silicon-Rich-Nitride (SRN) layers in contact with the porous $SiO_2$ layer, wherein the two injector SRN layers sandwich the porous $SiO_2$ layer, and wherein each of the two injector SRN layers is within a range between 1 to 2 nm thick.

39. The programmable integrated circuit of claim 38, wherein the porous $SiO_2$ layer includes voids formed using a Spin-On-Glass Hydrogen Silisesquioxane (SOG-HSQ) method.

40. The programmable integrated circuit of claim 38, wherein the porous $SiO_2$ layer includes voids formed using surface transformation.

41. The programmable integrated circuit of claim 38, wherein the porous $SiO_2$ layer includes voids formed by imprinting a pattern of nano-impressions into a pattern resist layer, performing a reactive ion etching (RIE) process, and overlaying the pattern of nano-impressions using an antifuse dielectric that has poor step coverage.

* * * * *

UNITED STATES PATENT AND TRADEMARK OFFICE
CERTIFICATE OF CORRECTION

PATENT NO. : 6,979,880 B2
APPLICATION NO. : 10/931601
DATED : December 27, 2005
INVENTOR(S) : Bhattacharyya et al.

It is certified that error appears in the above-identified patent and that said Letters Patent is hereby corrected as shown below:

On page 2, in field (56), under "Other Publications", in column 2, line 29, delete "(inteface)" and insert -- (interface) --, therefor.

In column 4, line 48, delete "2.5x" and insert -- 2.5X --, therefor.

In column 7, line 29, delete "($\lambda_{eff(P)}$)" and insert -- ($k_{eff(P)}$) --, therefor.

In column 7, line 31, (in Equation 3), after "(1-f)" insert -- . --.

In column 8, line 28, delete "Vol" and insert -- Vol. --, therefor.

In column 10, line 7-9 (in Equation 12), after "$T_P = \dfrac{27.83 \times R^3_C}{D^2_{NT}}$" insert -- . --.

Signed and Sealed this

Sixth Day of March, 2007

JON W. DUDAS
*Director of the United States Patent and Trademark Office*